(12) United States Patent
Jen et al.

(10) Patent No.: US 8,217,390 B2
(45) Date of Patent: Jul. 10, 2012

(54) POLYMER CHARGE TRANSPORT MATERIAL FOR OPTOELECTRONIC DEVICES

(75) Inventors: Kwan-Yue Jen, Kenmore, WA (US); Fei Huang, Guangdong (CN); Yuhua Niu, Newton, MA (US); Yong Zhang, Guangdong (CN)

(73) Assignee: University of Washington, Seattle, WA (US)

( * ) Notice: Subject to any disclaimer, the term of this patent is extended or adjusted under 35 U.S.C. 154(b) by 422 days.

(21) Appl. No.: 12/483,176

(22) Filed: Jun. 11, 2009

(65) Prior Publication Data

US 2010/0051915 A1    Mar. 4, 2010

Related U.S. Application Data

(63) Continuation of application No. PCT/US2007/087474, filed on Dec. 13, 2007.

(60) Provisional application No. 60/869,857, filed on Dec. 13, 2006.

(51) Int. Cl.
*H01L 35/24* (2006.01)
(52) U.S. Cl. .................. 257/40; 257/E51.001; 558/242; 564/306
(58) Field of Classification Search .................. 257/40, 257/E51.001; 558/242; 564/306
See application file for complete search history.

(56) References Cited

U.S. PATENT DOCUMENTS

| | | | |
|---|---|---|---|
| 4,801,734 | A | 1/1989 | Kock |
| 2004/0214039 | A1 | 10/2004 | Mackenzie |
| 2004/0263045 | A1 | 12/2004 | Smith |
| 2004/0265737 | A1 | 12/2004 | Hanamura |

FOREIGN PATENT DOCUMENTS

WO    2007126929 A2    11/2007

OTHER PUBLICATIONS

Huang, F., et al., "A Conjugated, Neutral Surfactant as Electron-Injection Material for High-Efficiency Polymer Light-Emitting Diodes," Advanced Materials 19(15):2010-2014, Aug. 2007.
Huang, F., et al., "High-Efficiency, Environment-Friendly Electroluminescent Polymers with Stable High Work Function Metal as a Cathode: Green- and Yellow-Emitting Conjugated Polyfluorene Polyelectrolytes and Their Neutral Precursors," Journal of the American Chemical Society 126(31):9845-9853, Aug. 2004.
Huang, F., et al., "Novel Electroluminescent Conjugated Polyelectrolytes Based on Polyfluorene," Chemistry of Materials, 16(4):708-716, Feb. 2004.
Michota, A., et al., "Molecular Structure of Cysteamine Monolayers on Silver and Gold Substrates; Comparative Studies by Surface-Enhanced Raman Scattering," Surface Science 502-503:214-218, Apr. 2002.
Wu, H., et al., "Efficient Electron Injection from a Bilayer Cathode Consisting of Aluminum and Alcohol-/Water-Soluble Conjugated Polymers," Advanced Materials 16(20):1826-1830, Oct. 2004.
Wu, H., et al., "High-Efficiency Electron Injection Cathode of Au for Polymer Light-Emitting Devices," Organic Electronics 6(3):118-128, Jun. 2005.
Zhou, G., "Efficient Blue Electroluminescence from Neutral Alcohol-Soluble Polyfluorenes with Aluminum Cathode," Applied Physics Letters 89:233501-1-233501-3, Dec. 2006.

*Primary Examiner* — Anthony Ho
(74) *Attorney, Agent, or Firm* — Christensen O'Connor Johnson Kindness PLLC

(57) ABSTRACT

Polymers that enable the use of high work-function metals as a cathode in optoelectronic devices and optoelectronic devices incorporating the polymers as an electron transport layer.

10 Claims, 16 Drawing Sheets

POLYMER CHARGE TRANSPORT MATERIAL FOR OPTOELECTRONIC DEVICES

CROSS-REFERENCE TO RELATED APPLICATION

This application is a continuation of International Application No. PCT/US2007/087474, filed Dec. 13, 2007, which claims the benefit of U.S. Provisional Application No. 60/869,857, filed Dec. 13, 2006. Each application is expressly incorporated herein by reference in its entirety.

BACKGROUND OF THE INVENTION

Significant improvements have been made in organic light-emitting diode (OLED) technology, including improved efficiency, high brightness, and low drive voltage. Advances in the field have led to the realization of high-efficiency full-color and white-color OLEDs. Despite advances, operational stability remains a challenge for OLED technology. One avenue for producing higher efficiency devices utilizes low work-function metals (such as Ca or Ba), which are useful as cathode materials to facilitate electron injection. However, low work-function metals are very sensitive to moisture and oxygen and operation often causes the formation of quenching sites at areas near the interface between the electroluminescent layer (EL) and cathode. Additionally, metal ions formed at the interface tend to migrate into the EL layer, thus affecting the long-term stability of these devices.

One solution to these problems is the use of high work-function metals (such as Al, Ag, or Au) as cathode materials because of improved environmental stability and increased simplicity fabricating devices. While high work-function metals have improved stability, they suffer from poor electron injection into the EL material. Improved electron injection from high work-function metals has been attempted by inserting a thin layer of polar or ionic insulating species, such as lithium fluoride (LiF) or cesium fluoride (CsF). However, these methods exhibit cathode-material dependence and they are not universally applicable to other high work-function metals such as Ag or Au. There still remains a need for an efficient electron injection material that is compatible with high work-function cathodes but does not degrade device performance during operation.

SUMMARY OF THE INVENTION

The present invention provides polymers useful as charge transport materials and optoelectronic devices that include the polymers intermediate a cathode and an active layer. The polymers of the invention have repeat units containing aromatic groups and hydrophilic pendant groups. The polymers enable optoelectronic devices to be fabricated with high work-function cathode materials that outperform, and are more stable than, similar devices fabricated with low work-function cathode materials.

In one aspect, the present invention provides an optoelectronic device. In one embodiment, the optoelectronic device includes a first electrode; a second electrode; an active layer intermediate the first and second electrodes; and a transport layer intermediate the second electrode and the active layer, where the transport layer includes a polymer having repeat units, where a plurality of the repeat units have one or more nonionic pendant groups terminating with a hydrophilic group, and where the hydrophilic group terminates with one or more hydroxyl or thiol groups.

In one aspect, the invention includes a nonionic polymer. In one embodiment, the polymer includes repeating units having the structure:

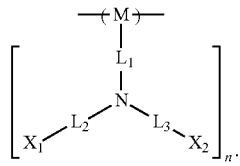

In this embodiment, M is a repeat unit; $L_1$, $L_2$, and $L_3$ are independently selected from the group of C2 to C20 alkylene and O2 to O20 polyether; $X_1$ and $X_2$ are independently selected from the group of hydroxyl and thiol; and n is 1 or 2.

In another embodiment, the polymer includes repeating units having the structure:

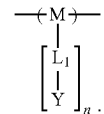

In this embodiment, M is a repeat unit; $L_1$ is selected from the group of C2 to C20 alkylene and O2 to O20 polyether; n is 1 or 2; and Y is selected from the group of:

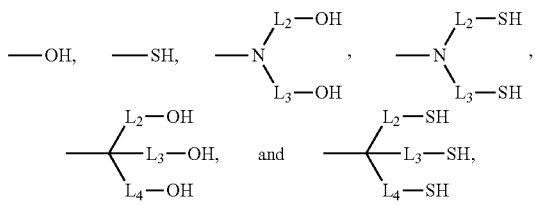

where $L_2$, $L_3$, and $L_4$ are independently selected from the group of C2 to C20 alkylene and O2 to O20 polyether.

In one aspect, the invention provides optoelectronic devices. In one embodiment, the devices includes a first electrode, a second electrode, an active layer intermediate the first and second electrodes, and a transport layer intermediate the second electrode and the active layer, where the transport layer is a nonionic polymer of the invention.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
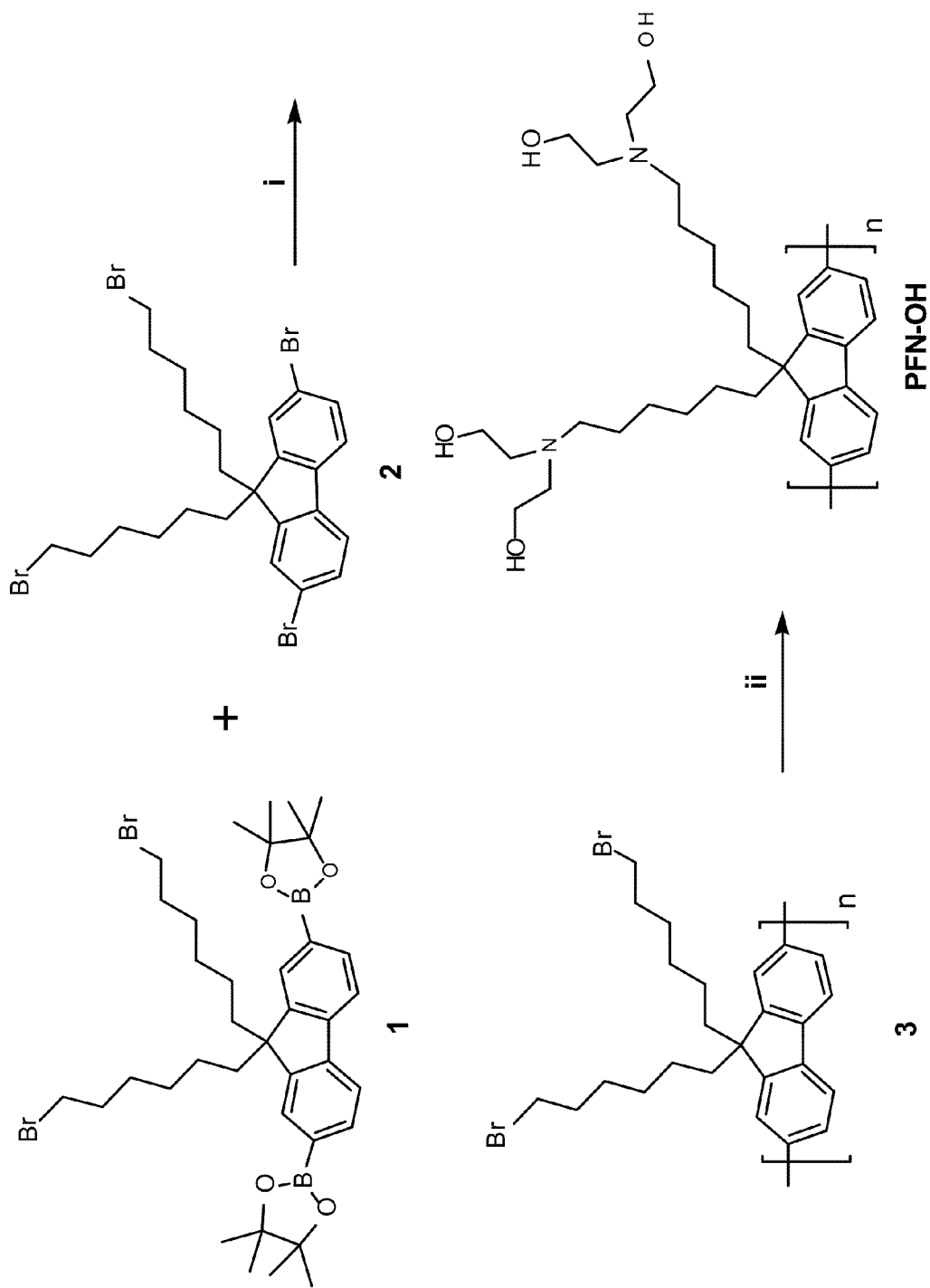
FIG. 1 illustrates the synthesis of a representative polymer of the invention.

The present invention provides polymers useful as charge transport materials and optoelectronic devices that include the polymers. The polymers of the invention have repeat units containing aromatic groups and hydrophilic pendant groups. The polymers enable optoelectronic devices to be fabricated with high work-function cathode materials that outperform, and are more stable than, similar devices fabricated with low work-function cathode materials.

In one aspect, the present invention provides an optoelectronic device. In one embodiment, the optoelectronic device includes a first electrode; a second electrode; an active layer intermediate the first and second electrodes; and a transport layer intermediate the second electrode and the active layer, where the transport layer includes a polymer having repeat units, where a plurality of the repeat units have one or more nonionic pendant groups terminating with a hydrophilic group, and where the hydrophilic group terminates with one or more hydroxyl or thiol groups. The transport layer is a layer that facilitates the transfer of electrical charges (e.g., electrons) between layers of an optoelectronic device (e.g., electroluminescent or photovoltaic devices). When a transport layer is intermediate a cathode and an emissive layer (EML) in an optoelectronic device, it can be referred to as an electron injection layer. As used herein, the terms "transport layer" (TL) and "electron injection layer" (EI layer) are used interchangeably. The polymer useful in the transport layer of the device of the invention has three primary components: the repeat units that make up the backbone of the polymer; nonionic hydrophilic groups; and linkers covalently connecting the nonionic hydrophilic groups to the repeat units. As used herein, the term "polymer" refers to a chemical compound having more than one repeat units (monomer units) that are covalently coupled. Polymers useful in the invention include compounds that are sometimes referred to in the art as oligomers. As used herein, the term "repeat units" refers to the repeating units making up the polymer backbone. The repeat units are derived from the monomers and comonomers used in making the polymers useful in the electron transport layer. The repeat units include aromatic groups. The term "nonionic hydrophilic group" refers to hydrophilic groups that are not charged (i.e., not ionic at pHs used to make or operate the devices). The nonionic hydrophilic groups include hydrophilic functional groups such as hydroxyl or thiol groups, and branched groups that may include a heteroatom, such as an amine.

In one embodiment, the polymer is a conjugated polymer. The conjugated repeat unit provides enhanced electron transport and the hydrophilic pendant groups afford solubility in polar solvents and improved electron injection from the cathode. A representative polymer useful in the invention, poly [9,9-bis(6'-(diethanolamino)hexyl)fluorene] (PFN-OH), is described in Example 1 and illustrated in FIG. 1. PFN-OH has a conjugated repeat unit (fluorene) and a nonionic pendant group ((diethanolamino)hexyl) terminating with a hydrophilic group (OH). In one embodiment, the transport layer includes poly[9,9-bis(6'-(diethanolamino)hexyl)fluorene]. PFN-OH is soluble in polar solvents, such as alcohols, which are orthogonal to most of the solvents that dissolve EL conjugated polymers. In one embodiment, the transport layer material has a solubility orthogonal to the solubility of the active layer. As used herein, the term "orthogonal," when in reference to salvation, means that a material soluble in one solvent will be substantially insoluble in an orthogonal solvent. When using orthogonal solvent materials, device processing is simplified because interfacial mixing is prevented between the transport layer and any adjacent device layers. The fabrication of representative devices of the invention and the syntheses of representative polymers of the invention are described in Examples 1, 2, and 3.

In one embodiment, the repeat units are selected from:

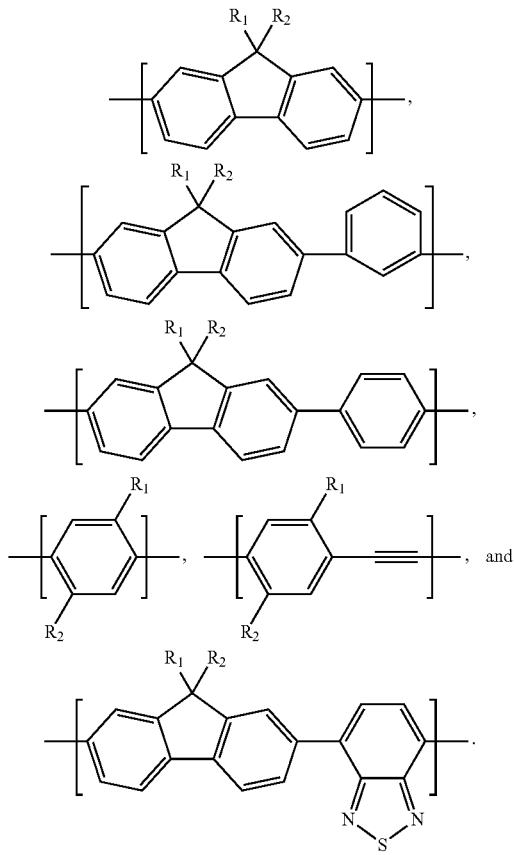

In these embodiments, $R_1$ is a nonionic pendant group terminating with a hydrophilic group and $R_2$ is selected from hydrogen, alkyl, and a nonionic pendant group terminating with a hydrophilic group.

Polymers of the invention include aromatic-containing repeat units that are both conjugated and non-conjugated. In one embodiment, the repeat units have at least one aromatic group. In one embodiment, the repeat units are selected from:

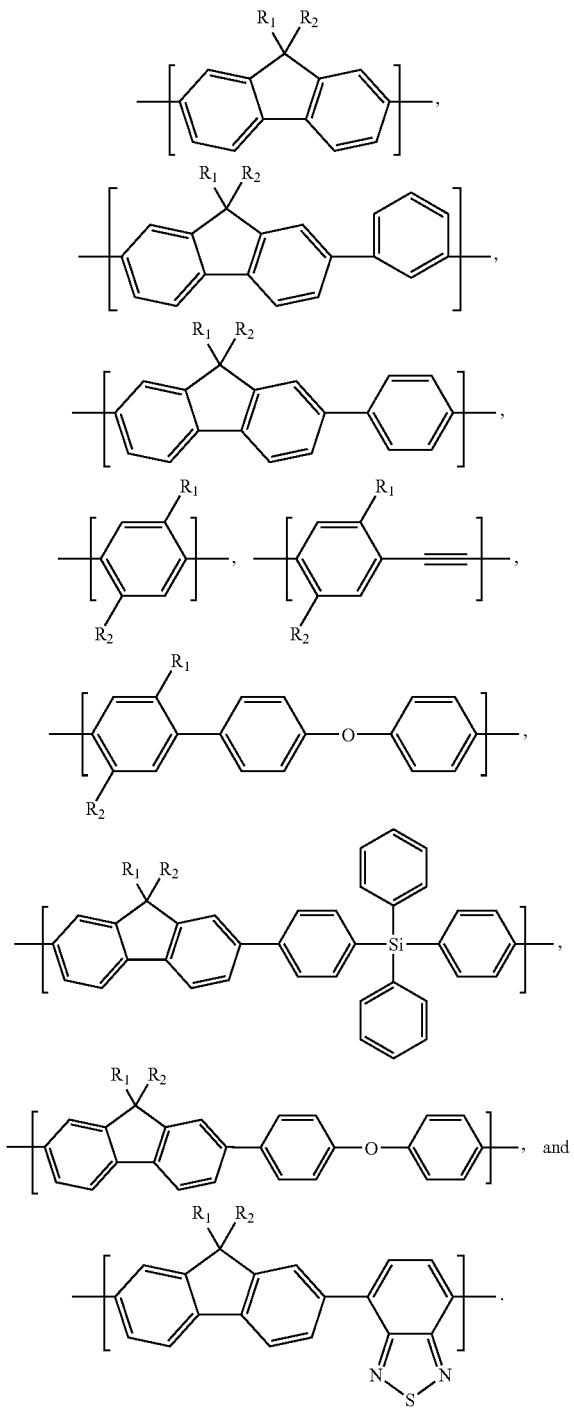

In these embodiments, $R_1$ is a nonionic pendant group terminating with a hydrophilic group, and $R_2$ is selected from hydrogen, alkyl, and a nonionic pendant group terminating with a hydrophilic group.

The hydrophilic group at the terminus of the nonionic pendant group typically has two functions: providing increased solubility for the polymer in polar solvents and increasing the electron injection efficiency in devices made with the polymer. The hydrophilic group includes a hydroxyl or thiol and is covalently coupled to the repeat unit of the polymer through a linker. In a representative embodiment, the hydrophilic group is a hydroxyl-terminated amine. In one embodiment, the hydrophilic group is a diethanolamino group.

The pendant group is covalently coupled to the repeat unit through a linker. In one embodiment, the linker is an alkylene or a polyether group. As used herein, the term "alkylene" refers to divalent alkyl groups (e.g., $-(CH_2)_m-$), where m is from 2 to 20; C2 to C20 alkylene). The term "polyether" refers to linkers that include two or more ether linkages. Representative polyether linkers include poly(alkylene oxides), such as poly(ethylene oxide) ($-(CH_2CH_2O)_m-$, where m is 2 to 20; O2 to O20 polyether) and poly(propylene oxide) ($-(C_3H_6O)_m-$, where m is 2 to 20; O2 to O20 polyether). The use of polyether groups as a linker further increases the hydrophilicity of the polymer. In one embodiment, the polyether group is a poly(alkylene oxide), such as a poly(ethylene oxide) or a poly(propylene oxide). The synthesis of polymers of the invention that include polyether linkers and devices that include the polymers are described in Example 3.

Figure 2:
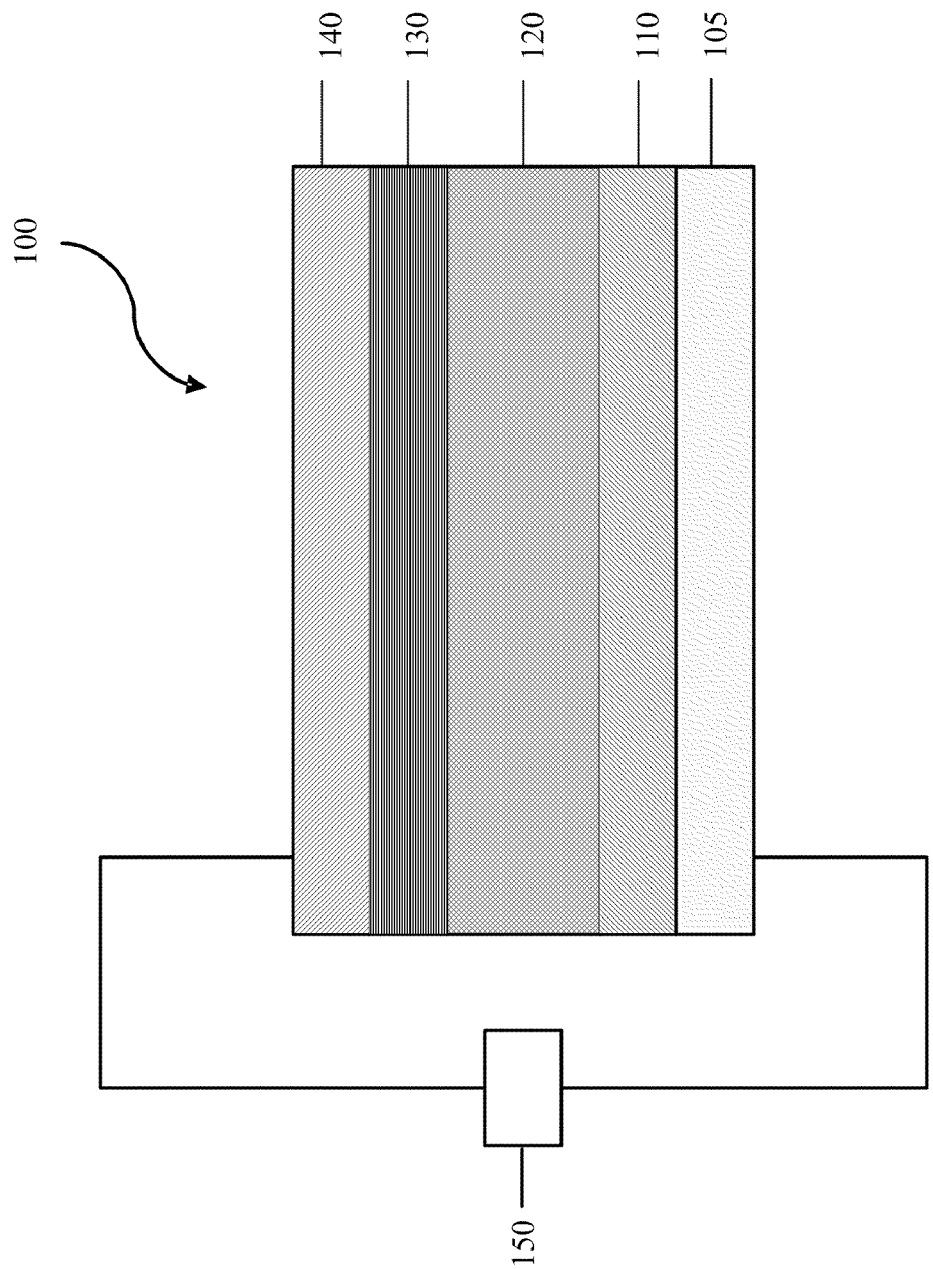
FIG. 2 illustrates a representative device of the invention.

Representative optoelectronic devices of the invention include electroluminescent devices (e.g., OLEDs) and photovoltaic devices. The active layer of the device partially defines the function of the device. An electroluminescent device has an electroluminescent active layer and a photovoltaic device has a photovoltaic active layer. In one embodiment, the optoelectronic device is an electroluminescent device. Electroluminescent devices of the invention can be fabricated using well-known microelectronic and semiconductor processing techniques known to those skilled in the art. The most common form of electroluminescent device embodied by the present invention is the organic light-emitting diode (OLED), also called a polymer light-emitting diode (PLED) when a polymer is used as the electroluminescent layer. As used herein, the terms OLED and PLED are used interchangeably. A typical device 100 is illustrated in FIG. 2 and includes a substrate 105 and a first electrode 110. In one embodiment, the first electrode is an anode. In one embodiment, the first electrode is either indium-tin-oxide (ITO) or fluorine-tin-oxide. Any transparent conductive material is useful as an anode. Conductive organic films, including conductive plastics and conductive organic/inorganic hybrid composites, are representative examples of transparent conductive materials. Electroluminescent film-forming materials in liquid form are deposited on the first electrode, typically by spin coating, drop coating, or other solution-based deposition techniques. The film deposition technique forms a solid film that can then be cured at an elevated temperature so as to evaporate any remaining solvent. The product is the active layer, an electroluminescent film 120. In one embodiment, the active layer includes an emissive material that is one of poly(2-methoxy-5-(2'-ethylhexyloxy)-p-phenylene vinylene), polyphenylene vinylene, and a polyfluorene. An electron injection layer 130 is made on the electroluminescent film by a solution-based deposition technique. The EI layer includes a polymer of the invention. In one embodiment, the EI layer has a thickness of from about 1 nm to about 15 nm. A second electrode 140 is deposited on the EI layer. In one embodiment, the second electrode is a cathode. In one embodiment, the second electrode is a high work-function material. As used herein, the term "high work-function material" refers to an electrode material with a work function greater than (i.e., more negative than) about −3.5 eV.

A representative second electrode is a metallic electrode deposited by an evaporation or sputtering technique. Representative second electrode materials include gold, silver, aluminum, magnesium, calcium, cesium fluoride, lithium fluoride, combinations of the materials (i.e., aluminum-capped CsF), and other electrode materials known to those skilled in the art.

Figure 3:
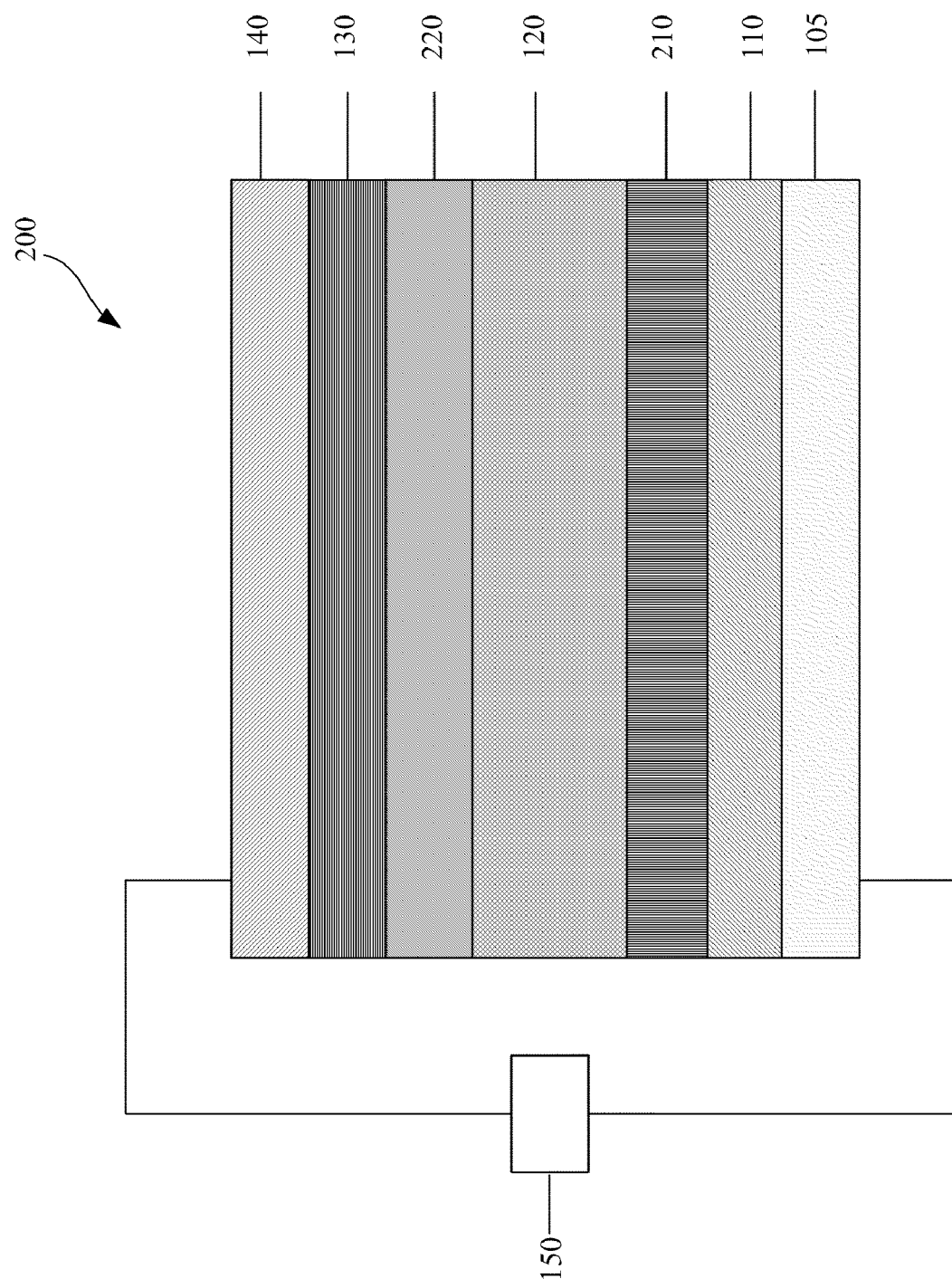
FIG. 3 illustrates a representative device of the invention.

Electroluminescent devices of the invention may also incorporate hole- or additional electron-transporting materials, or both, into the overall device structure. These charge-transporting materials allow for both efficient injection of charges from the electrodes into the electroluminescent layer and also allow for tuning of the number and location of holes and/or electrons in the device. In addition, the hole-transporting layer can also function as an electron-blocking and exciton-confining layer at the anode side, and the electron-transporting layer can function as a hole-blocking and exciton-confining layer at the cathode side. A complex device 200, as illustrated in FIG. 3, can optionally include a hole-injection/transport layer 210 incorporated into the device to improve charge injection and transport. A second electron-injection/transport layer 220 can optionally be inserted intermediate the electroluminescent film and the EI layer. The remaining reference numerals in FIG. 3 identify the same components as in FIG. 2.

In the representative devices described above, the first electrode 110 will act as an anode and will produce holes in the device. To improve the efficiency of hole injection into the device, a hole injection layer 210 may be deposited on the first electrode before the electroluminescent film is formed. A hole-injection layer can be deposited either by solution-based or vapor-based techniques. In one embodiment, the device includes a hole-injection buffer layer intermediate the active layer and the first electrode. In a further embodiment, the hole-injection buffer layer includes poly(3,4-ethylene dioxythiophene):poly(styrene sulfonic acid) or polyaniline. To improve the efficiency of electron injection into the device, a second electron injection layer 220 may be deposited on the electroluminescent layer before the EI layer is formed. An electron-injection layer can be deposited either by solution-based or vapor-based techniques. In one embodiment, the device has an electron-injection buffer layer intermediate the emissive layer and the EI layer. The completed device (either 100 or 200) can be operated by attaching the anode and cathode to an electrical power supply 150. When the device is run in forward bias, the electrons and holes produced at the cathode and anode, respectively, will migrate through any charge-transporting layers and will recombine in the EL material.

In one embodiment, electroluminescent devices of the invention also include a substrate 105 adjacent the first or second electrode. Because the representative transparent conductor ITO is traditionally commercially available as a thin-film coating on glass or plastic, representative electroluminescent devices are fabricated using ITO supported on a substrate. In a further embodiment, the substrate is glass or plastic. In a further embodiment, the substrate is adjacent to the first electrode, and the substrate is glass and the first electrode is ITO. From the substrate to the second electrode, the layers of a representative electroluminescent device are: substrate, first electrode (anode), electroluminescent layer, EI layer, and second electrode (cathode). More complex electroluminescent devices may optionally include a hole-injection/transport layer intermediate the first electrode and the electroluminescent layer and/or a second electron-injection/transport layer intermediate the electroluminescent layer and the EI layer.

The representative devices illustrated in FIGS. 2 and 3 (100 and 200, respectively) can be used as photovoltaic devices. In one embodiment, the device is a photovoltaic device. For photovoltaic device operation, the active layer is a photovoltaic material and the electrical power supply 150 is a device in need of electricity (e.g., a depleted rechargeable battery) and the device will operate to convert electromagnetic radiation into electricity. The operation of both electroluminescent and photovoltaic devices are well known to those of skill in the art.

The use of high work-function metals in OLEDs is desirable because device stability is improved and fabrication is simplified. Polymers of the invention, such as PFN-OH, can enhance the performance of devices having high work-function metals including aluminum, silver, and gold. Table 1 compares the performance of OLEDs having the configuration ITO/PEDOT/PF3B:PHF [1:5]/cathode and a typical current density of 35 mA/cm$^2$. Devices of the invention in Table 1 include the EI layer PFN-OH.

TABLE 1

Comparison of representative devices of the invention to typical OLED devices.

| Cathode | $\lambda_{max}$ (nm) | $V_{on}$ | Voltage | Luminance (cd/m$^2$) | QE (%) | LE (cd/A) | Maximum Brightness (cd/m$^2$) | Maximum LE (cd/A) |
|---|---|---|---|---|---|---|---|---|
| Ca/Ag | 533 | 3.4 | 4.3 | 297 | 0.25 | 0.85 | 3630 | 0.902 |
| Al | 532 | 5.4 | 5.9 | 43.6 | 0.035 | 0.125 | 566 | 0.127 |
| PFN-OH/Al | 533 | 3.6 | 4.4 | 2618 | 2.08 | 7.48 | 34900 | 10.4 |
| Ag | 533 | 5.6 | 6.0 | 13.9 | 0.011 | 0.040 | 1080 | 0.174 |
| PFN-OH/Ag | 534 | 5.2 | 6.1 | 1405 | 1.06 | 4.01 | 32800 | 5.04 |
| Au | 534 | 8.4 | 7.6 | Not detectable | | | 97 | 0.0087 |
| PFN-OH/Au | 541 | 5.2 | 5.6 | 959 | 0.778 | 2.74 | 6070 | 2.99 |

$V_{on}$: voltage required to produce 1 cd/m$^2$.
Voltage: voltage at current density of 35 mA/cm$^2$.
QE: quantum efficiency at current density of 35 mA/cm$^2$.
LE: luminescent efficiency at current density of 35 mA/cm$^2$.

Devices in Table 1 having neat Ag or Au (i.e., metal only, no EI layer) as a cathode perform poorly. When the polymer of the invention PFN-OH is used as an EI layer, the performance of the devices are greatly improved. The PFN-OH/Ag device in Table 1 has a LE of 4.01 cd/A, compared with the neat Ag electrode device having a LE of 0.04 cd/A. Similarly, the PFN-OH/Au device has a LE of 2.74 cd/A, whereas the neat Au device is non-luminescent.

White organic light-emitting diodes (WOLED) are also representative devices of the invention that incorporate polymers of the invention. WOLED fabrication is described further in Example 2. White light is generated through the use of multiple emitters in a single device. The emitters are typically a combination of emitting guests in a host material that can also be electroluminescent. Thus, the active layer may include multiple emitters. In one embodiment, the active layer comprises a first emitter and a second emitter. Table 2 compares the performance of WOLED devices of the invention with control devices having neat Al or Ba/Al as the cathode. Ba is a low work-function electron injection material. The emissive materials of the devices compared in Table 2 are FIrpic (blue) and Os-R (orange) in a PVK/OXD-7 host.

TABLE 2

Representative WOLED performance (device structure: ITO/PEDOT/FIrpic(5 wt %): Os-R(0.15 wt %): PVK:OXD-7(30 wt %)/cathode).

| Cathode | $V_{on}$ (V) | $QE_{max}$ (%) | $LE_{max}$ (cd/A) | $PE_{max}$ (lm/W) | $B_{max}$ (cd/m$^2$) | $V_{B\,max}$ (V) | CIE1931 (x, y) |
|---|---|---|---|---|---|---|---|
| Al | 6.7 | 0.34 | 0.62 | 0.24 | 1030 | 11.6 | (0.317, 0.348) |
| Ba/Al | 4.7 | 3.30 | 6.18 | 3.23 | 10600 | 10.6 | (0.314, 0.347) |
| PFN-OH(ethanol)/Al | 4.4 | 2.35 | 4.83 | 3.12 | 4680 | 10.6 | (0.225, 0.329) |
| PFN-OH(water/ethanol/)/Al | 4.5 | 10.7 | 20.7 | 13.2 | 21600 | 12.6 | (0.324, 0.355) |
| PFN-OH(water/ethanol)/Ba/Al | 3.9 | 11.6 | 20.4 | 14.5 | 21200 | 10.1 | (0.312, 0.355) |

$V_{on}$: voltage required to produce 1 cd/m$^2$.
QE: quantum efficiency at current density of 35 mA/cm$^2$.
LE: luminescent efficiency at current density of 35 mA/cm$^2$.
PE: power efficiency.
$B_{max}$: maximum brightness.
$V_{B\text{-}max}$: voltage required to achieve maximum brightness.
CIE1931: Commission Internationale de l'Eclairage (CIE) color values.

WOLEDs of the invention have high brightness and efficient white emission, as shown in Table 2. Device performance varies with the solvent used to deposit the transport layer (i.e., polymers of the invention) because the interface of the transport layer/emission layer or transport layer/cathode changes with the solvent system. PFN-OH deposited with ethanol yields a smooth (<1.0 nm rms) transport layer, while water/ethanol deposition yields a more rough transport layer (>1.0 nm rms). A transport layer processed from water/ethanol yields the most effective devices.

As noted above, in addition to optoelectronic devices, in another aspect, the invention provides polymers useful in devices. In one embodiment, the invention provides a non-ionic polymer that includes repeating units having the structure:

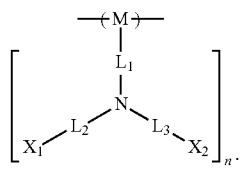

In this embodiment, M is a repeat unit; $L_1$, $L_2$, and $L_3$ are independently selected from the group of C2 to C20 alkylene and O2 to O20 polyether; $X_1$ and $X_2$ are independently selected from the group of hydroxyl and thiol; and n is 1 or 2.

Representative repeat units (M) include:

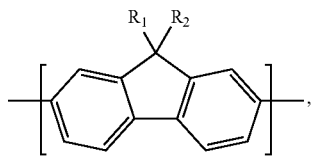

-continued

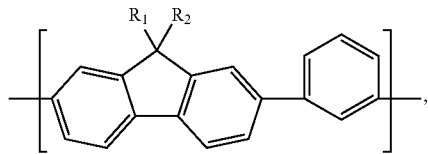

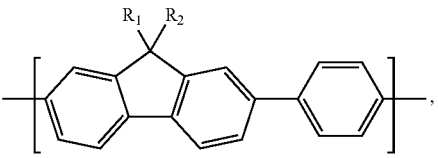

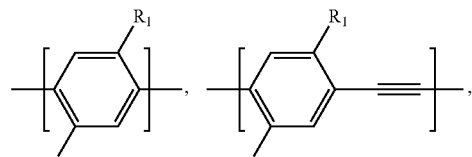

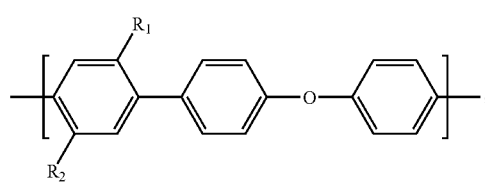

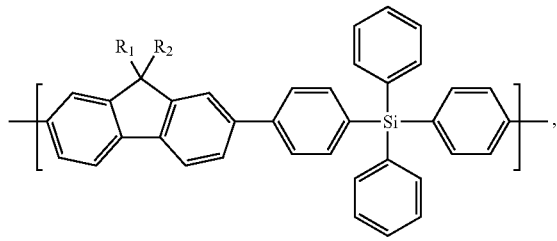

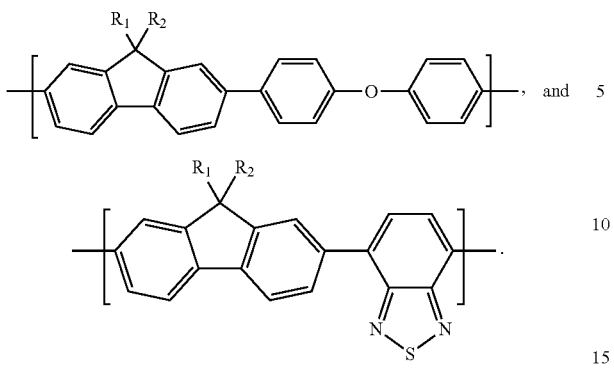

In these embodiments, $R_1$ is a nonionic pendant group terminating with a hydrophilic group, and $R_2$ is selected from hydrogen, alkyl, and a nonionic pendant group terminating with a hydrophilic group.

In one embodiment, M is

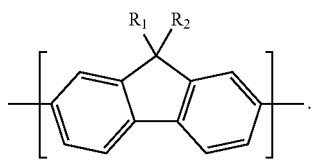

The polymer includes a linker, $L_1$. In one embodiment, $L_1$ is C6 alkylene or O2 polyether.

The terminal hydrophilic groups, X1 and X2, are linked to the nitrogen by linkers $L_2$ and $L_3$. In one embodiment, $L_2$ is a C2 alkylene. In one embodiment, $L_3$ is a C2 alkylene. In one embodiment, $X_1$ and $X_2$ are independently selected from the group of OH and SH.

The polymers of the invention include from about 3 to about 1000 repeat units.

Polymers of the invention include copolymers having two or more different repeat units. One or more of the repeat units contain nonionic pendant groups terminating with a hydrophilic group. Thus, in one embodiment, the polymer includes second repeat units (i.e., the polymer is a copolymer). Representative second repeat units include:

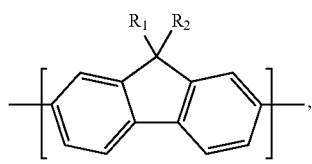

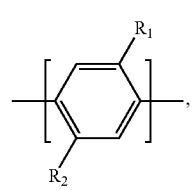

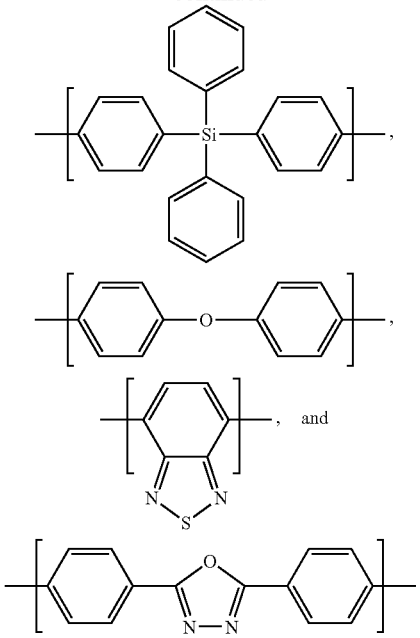

In these embodiments, $R_1$ and $R_2$ are independently selected from hydrogen, alkyl, and a nonionic pendant group terminating with a hydrophilic group.

In another embodiment, the invention provides a nonionic polymer that includes repeating units having the structure:

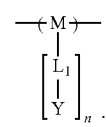

In this embodiment, M is a repeat unit; $L_1$ is selected from the group of C2 to C20 alkylene and O2 to O20 polyether; n is 1 or 2; and Y is selected from the group of:

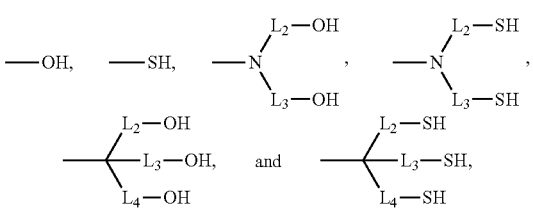

where $L_2$, $L_3$, and $L_4$ are independently selected from the group of C2 to C20 alkylene and O2 to O20 polyether. The polymers of the invention include from about 3 to about 1000 repeat units.

Representative repeat units (M) include:

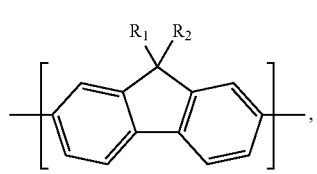

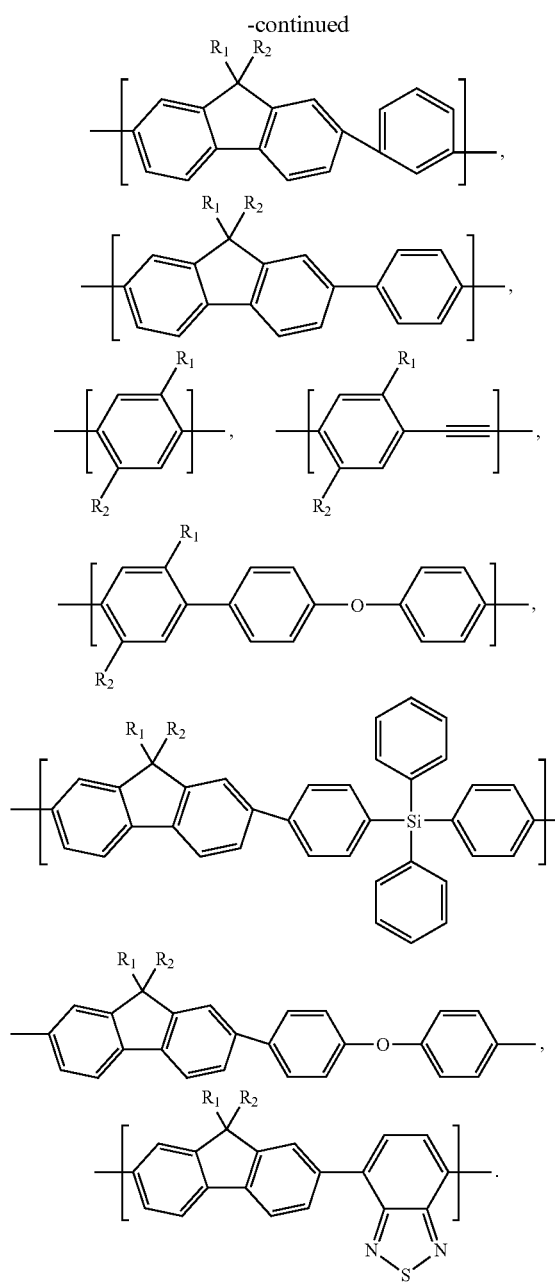

In these embodiments, $R_1$ is a nonionic pendant group terminating with a hydrophilic group, and $R_2$ is selected from hydrogen, alkyl, and a nonionic pendant group terminating with a hydrophilic group.

In one embodiment, M is

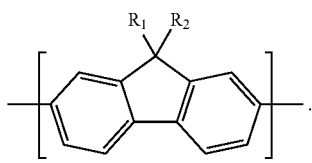

The polymers of the invention include from about 3 to about 1000 repeat units.

Polymers of the invention include copolymers having two or more different repeat units. One or more of the repeat units contain nonionic pendant groups terminating with a hydrophilic group. Thus, in one embodiment, the polymer includes second repeat units (i.e., the polymer is a copolymer). Representative second repeat units include:

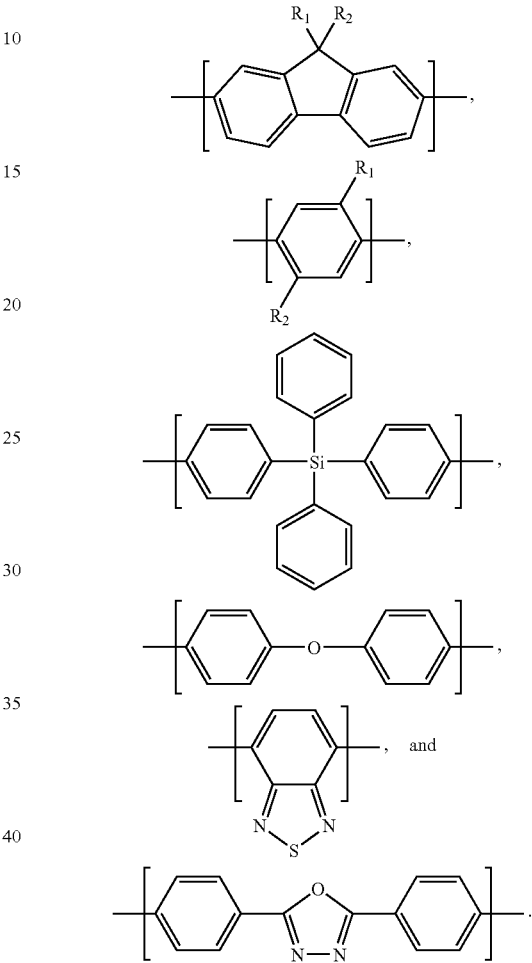

In these embodiments, $R_1$ and $R_2$ are independently selected from hydrogen, alkyl, and a nonionic pendant group terminating with a hydrophilic group.

As noted above, the invention provides optoelectronic devices that include a first electrode, a second electrode, an active layer intermediate the first and second electrodes, and a transport layer intermediate the second electrode and the active layer, where the transport layer includes a nonionic polymer of the invention described above.

The following definitions are provided for the purpose of clarity when defining the invention.

"Alkyl" is a saturated or unsaturated, straight or branched, cyclic or multicyclic aliphatic (i.e., non-aromatic) hydrocarbon group containing from 1 to about 30 carbons. Independently the hydrocarbon group, in various embodiments: has zero branches (i.e., is a straight chain), one branch, two branches, or more than two branches; is saturated; is unsaturated (where an unsaturated alkyl group may have one double bond, two double bonds, more than two double bonds, and/or one triple bond, two triple bonds, or more than three triple bonds); is, or includes, a cyclic structure; is acyclic.

Exemplary alkyl groups include C1 alkyl (i.e., —CH$_3$ (methyl)), C2 alkyl (i.e., —CH$_2$CH$_3$ (ethyl), —CH═CH$_2$ (ethenyl) and —C≡CH (ethynyl)) and C3 alkyl (i.e., —CH$_2$CH$_2$CH$_3$ (n-propyl), —CH(CH$_3$)$_2$ (i-propyl), —CH═CH—CH$_3$ (1-propenyl), —C≡C—CH$_3$ (1-propynyl), —CH$_2$—CH═CH$_2$ (2-propenyl), —CH$_2$—C≡CH (2-propynyl), —C(CH$_3$)═CH$_2$ (1-methylethenyl), —CH (CH$_2$)$_2$ (cyclopropyl), and adamantly. The term "alkyl" also includes groups where at least one of the hydrogens of the hydrocarbon group is substituted with at least one of the following: alkyl; "aryl" as defined below; or "heteroalkyl" as defined below. One or more of the atoms in an alkyl group, with the exception of hydrogen, can be bonded to one or more of the atoms in an adjacent alkyl group, aryl group (aryl as defined below), or heteroalkyl group (heteroalkyl as defined below) to form one or more ring.

"Aryl" is a monocyclic or polycyclic aromatic ring system or a heteroaromatic ring system ("heteroaryl") containing from 3 to about 30 carbons. The ring system may be monocyclic or fused polycyclic (e.g., bicyclic, tricyclic, etc.). Preferred heteroatoms are nitrogen, oxygen, sulfur, and boron. In various embodiments, the monocyclic aryl ring is C5-C10, or C5-C7, or C5-C6, where these carbon numbers refer to the number of carbon atoms from the ring system. A C6 ring system, i.e., a phenyl ring, is a preferred aryl group. A C4-S ring system (i.e., a thiophene) is another preferred aryl group. In various embodiments, the polycyclic ring is a bicyclic aryl group, where preferred bicyclic aryl groups are C8-C12, or C9-C10. A naphthyl ring, which has 10 carbon atoms, is a preferred polycyclic aryl group. The term "aryl" also includes groups where at least one of the hydrogens of the aromatic or heteroaromatic ring system is substituted further with at least one of the following: alkyl; halogen; or heteroalkyl (as defined below). One or more of the atoms in an aryl group, with the exception of hydrogen, can be bonded to one or more of the atoms in an adjacent alkyl group, aryl group, or heteroalkyl group (heteroalkyl as defined below) to form one or more rings.

"Heteroalkyl" is an alkyl group (as defined herein) wherein at least one of the carbon atoms or hydrogen atoms is replaced with a heteroatom, with the proviso that at least one carbon atom must remain in the heteroalkyl group after the replacement of carbon or hydrogen with a heteroatom. Preferred heteroatoms are nitrogen, oxygen, sulfur, silicon, and halogen. A heteroatom may, but typically does not, have the same number of valence sites as the carbon or hydrogen atom it replaces. Accordingly, when a carbon is replaced with a heteroatom, the number of hydrogens bonded to the heteroatom may need to be increased or decreased to match the number of valence sites of the heteroatom. For instance, if carbon (valence of four) is replaced with nitrogen (valence of three), then one of the hydrogens formerly attached to the replaced carbon must be deleted. Likewise, if carbon is replaced with halogen (valence of one), then three (i.e., all) of the hydrogens formerly bonded to the replaced carbon must be deleted. Examples of heteroalkyls derived from alkyls by replacement of carbon or hydrogen with heteroatoms are shown immediately below. Exemplary heteroalkyl groups are methoxy (—OCH$_3$), amines (—CH$_2$NH$_2$), nitrites (—CN), carboxylic acids (—CO$_2$H), other functional groups, and dendrons. The term "heteroalkyl" also includes groups where at least one of the hydrogens of carbon or a heteroatom of the heteroalkyl may be substituted with at least one of the following: alkyl; aryl; and heteroalkyl. One or more of the atoms in a heteroalkyl group, with the exception of hydrogen, can be bonded to one or more of the atoms in an adjacent alkyl group, aryl group, or heteroalkyl group to form one or more rings.

The following examples are provided for the purpose of illustrating, not limiting, the invention.

EXAMPLES

Figure 4:
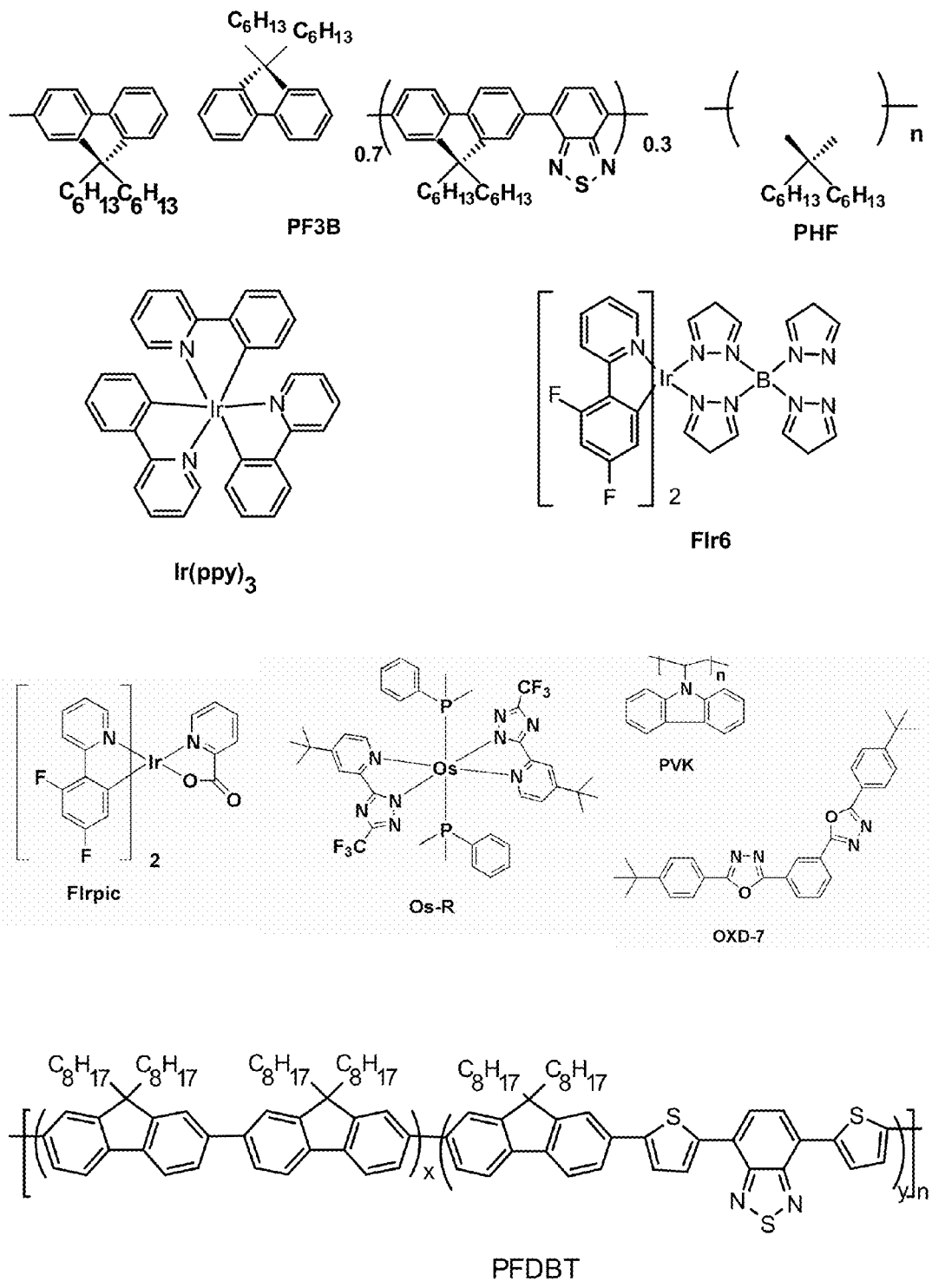
FIG. 4 illustrates compounds useful in devices of the invention.

Compounds useful in devices of the invention described in the below examples are illustrated in FIG. 4.

Example 1

A Representative Polymer of the Invention and Optoelectronic Devices Incorporating the Polymer The synthetic route for a representative transport layer useful in devices of the invention, poly[9,9-bis(6'-(diethanolamino)hexyl)-fluorene] (PFN-OH), is illustrated in FIG. 1. PFN-OH is soluble in polar solvents (such as alcohol, DMF and DMSO), which is orthogonal to most of the solvents that dissolve EL conjugated polymers. Device characteristics are summarized in Table 1.

Synthesis of starting materials and luminescent materials. PHF and PF3B were synthesized using the Suzuki coupling reaction (P. Herguth, X. Z. Jiang, M. S. Liu, A. K.-Y. Jen, *Macromolecules* 2002, 35, 6094). Ir(ppy)$_3$ (A. B. Tamayo, B. D. Alleyne, P. I. Djurovich, S. Lamansky, I. Tsyba, N. N. Ho, R. Bau, M. E. Thompson, *J. Am. Chem. Soc.* 2003, 125, 7377); FIr6 (J. Li, P. I. Djurovich, B. D. Alleyne, M. Yousufuddin, N. N. Ho, J. C. Thomas, J. C. Peters, R. Bau, M. E. Thompson, *Inorg. Chem.* 2005, 44, 1713); OXD-7 (C. Wang, G.-Y. Jung, A. S. Batsanov, M. R. Bryce, M. C. Petty, *J. Mater. Chem.*, 2002, 12, 173); and 2,7-Bis(4,4,5,5-tetramethyl-1,3,2-dioxaborolan-2-yl)-9,9-bis(6'-bromohexyl) fluorene 1 and 2,7-dibromo-9,9-bis(6'-bromohexyl)fluorene 2 (B. Liu, G. C. Bazan, *J. Am. Chem. Soc.* 2006, 128, 1188) were synthesized according to published procedures. PVK and 2-tert-butylphenyl-5-biphenyl-1,3,4-oxadiazole (PBD) were purchased from Aldrich and used as received.

Poly[9,9-bis(6'-bromohexyl)fluorene] 3 synthesis. The synthesis of PFN-OH is illustrated in FIG. 1, wherein: i) Pd(PPh$_3$)$_4$, 2M K$_2$CO$_3$, Toluene; and ii) HN(CH$_2$CH$_2$OH)$_2$, THF/DMF. The synthesis of PFN-OH begins with 2,7-bis(4,4,5,5-tetramethyl-1,3,2-dioxaborolan-2-yl)-9,9-bis(6'-bromohexyl)fluorene 1 (0.5 mmol, 372 mg), 2,7-dibromo-9,9-bis(6'-bromohexyl)fluorene 2 (0.5 mmol, 325 mg), and Pd(PPh$_3$)$_4$ (5 mg) were placed in a 25 ml round-bottom flask. A mixture of 2M K$_2$CO$_3$ aqueous solution (3 mL) and toluene (5 mL) were added to the flask and the reaction was degassed. The mixture was refluxed with vigorous stirring for 3 days under nitrogen atmosphere. After the mixture was cooled to room temperature, it was poured into 200 ml of methanol. The precipitated material 3 was recovered by filtration through a funnel. The resulting solid material was washed for 24 h using acetone to remove oligomers and catalyst residues (0.38 g, 77%). $^1$H NMR (300 Hz, CDCl$_3$), δ (ppm): 7.87-7.76 (m, 2H), 7.73-7.70 (m, 4H), 3.35-3.30 (m, 4H), 2.15 (m, 4H), 1.75-1.70 (m, 4H), 1.27-1.21 (m, 8H), 0.87-0.85 (m, 4H). Gel-permeation chromatography (GPC) analysis showed a number-average molecular weight of M$_n$=17500 g mol$^{-1}$ and a polydispersity of 2.4.

Poly[9,9-bis(6'-(diethanolamino)hexyl)-fluorene] (PFN-OH) synthesis. Diethanolamine (0.5 g) was added to a solution of polymer 3 (100 mg) in a mixture of tetrahydrofuran (10 mL) and DMF (10 mL). The mixture was stirred vigorously for 48 h at room temperature. After removing a substantial amount of the solvent under reduced pressure, water was added to precipitate the resulting polymer, which was then collected and dried in a vacuum oven to give PFN-OH (89 mg, 81%). $^1$H NMR (300 Hz, DMSO-d6), δ (ppm): 7.95-7.69 (m, 6H), 4.34 (m, 8H), 2.41-2.30 (m, 16H), 1.22-0.84 (m, 16H).

Device fabrication. Poly(3,4-ethylene dioxythiophene):poly(styrene sulfonic acid) (PEDOT:PSS, H. C. Stack) on indium tin oxide (ITO) was employed as the hole-injecting bilayer electrode. A 40 nm thick layer of PEDOT:PSS was spin-coated onto pre-cleaned and $O_2$-plasma-treated ITO substrates. The PEDOT:PSS layer was first baked at 100° C. for 0.5 h to remove residual water and then moved into a glovebox under argon to perform the subsequent multilayer deposition process. For fluorescence-based devices, a blend of PF3B and PHF with a weight ratio of 1:5 was used to form film of thickness around 70 nm from a chlorobenzene solution. For phosphorescence-based devices, triplet emitters and electron-transporting molecules were doped into a PVK host in a chlorobenzene solution and 70 nm thick films were formed via spin coating. The PVK blend film was dispersed with 30 wt % of PBD or OXD-7 as an electron transport material and an electrophosphorescent complex (1 wt % of Ir(ppy)$_3$ for green or 5 wt % of FIr6 for blue emitters). Samples were annealed at 80° C. for 30 min to remove the residual solvent. A PFN-OH thin film (20 nm) was deposited on the top of the emissive layer by spin coating from a 0.2 wt % ethanol solution, followed by drying inside a glovebox at 80° C. for 10 min. Finally, a 200 nm thick metal cathode film was thermally deposited through a shadow mask to form the top electrode in a vacuum of $1\times10^{-6}$ torr.

Electroluminescent device performance. Device testing was carried out in air at room temperature. EL spectra were recorded with an Oriel Instaspec IV spectrometer with a CCD detector. Current-voltage (I-V) characteristics were measured on a Hewlett-Packard 4155B semiconductor parameter analyzer. The power of the EL emission in the direction normal to the ITO was measured using a calibrated Si-photodiode and a Newport 2835-C multifunctional optical meter. Photometric units (cd/m$^2$) were calculated using the forward output power together with the EL spectra of the devices assuming a Lambertian space distribution. Photocurrent versus voltage measurements were made using a light intensity of 100 mW/cm$^2$ from a simulated AM1.5 light source (Oriel Co.). Open-circuit voltages were thus derived from the zero-current point on the photocurrent-voltage curves.

Figure 5A:
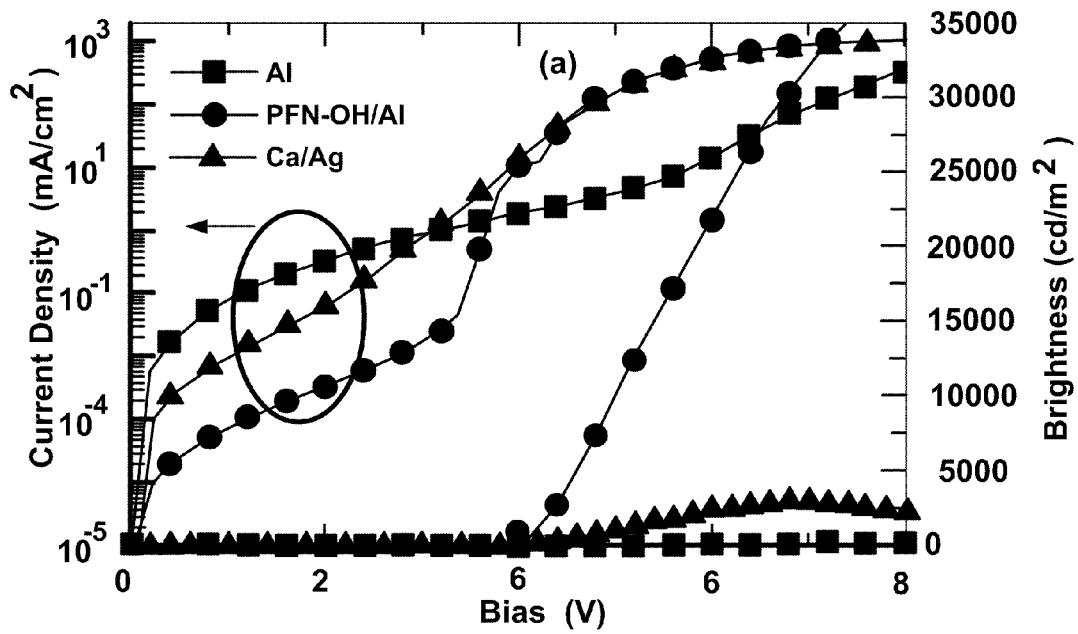
FIGS. 5A and 5B graphically compare the performance of representative devices of the invention and control devices.

A polymer blend of PF3B:PHF (1:5) was chosen as the emissive layer (EML) in OLEDs having device configurations designed to evaluate the electron injection property of PFN-OH. FIG. 5A compares the current density (J) and brightness (L) versus voltage (V) characteristics between different cathode systems (Al, Al/PFN-OH, and Ca/Ag) with a device configuration of indium tin oxide (ITO)/poly(3,4-ethylene dioxythiophene):poly(styrene sulfonic acid) (PEDOT:PSS)/EL layer/cathode. The PFN-OH device has improved electron injection compared to the neat Al cathode device, as indicated by a steeper exponential current increase after turn-on and higher current density at a similar voltage. In addition, the PFN-OH/Al device has a lower turn-on voltage (3.6 V) and higher brightness at the same voltage (L=21800 cd/m$^2$ at 6V) than those obtained from the neat Al device (turn-on voltage of 5.4V, L=52 cd/m$^2$ at 6V). The PFN-OH device shows a higher performance than the Ca-cathode device, widely considered the most effective cathode material. The maximum brightness of the measured PFN-OH/Al device reached 34900 cd/m$^2$, significantly higher than that obtained from a Ca/Ag device (<4000 cd/m$^2$).

Figure 5B:
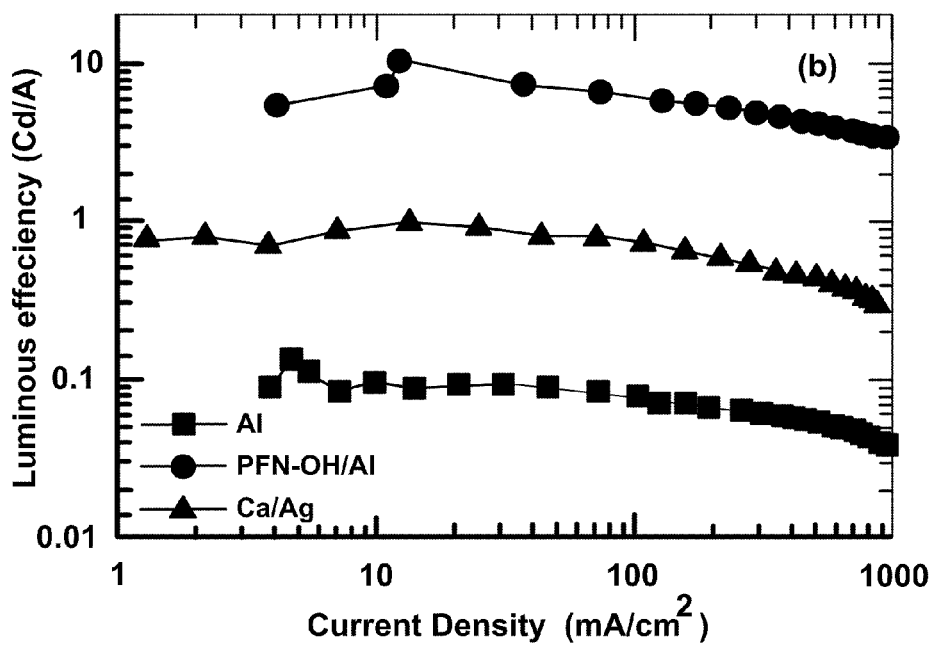

FIG. 5B compares the luminous efficiency (LE, cd/A) versus J characteristics for typical devices. Due to poor electron injection from the Al cathode to the EML, the LE of the neat Al cathode device is generally less than 0.2 cd/A, with a maximum luminescence of 566 cd/m$^2$. The measured PFN-OH devices have a maximum LE of 10.4 cd/A, more than 50 times higher than that of Al devices and 10 times higher than that of the Ca/Ag device. Importantly, the use of PFN-OH does not cause any significant increase in device operating voltage due the aromatic-containing repeat units providing better electron mobility.

Figure 6:
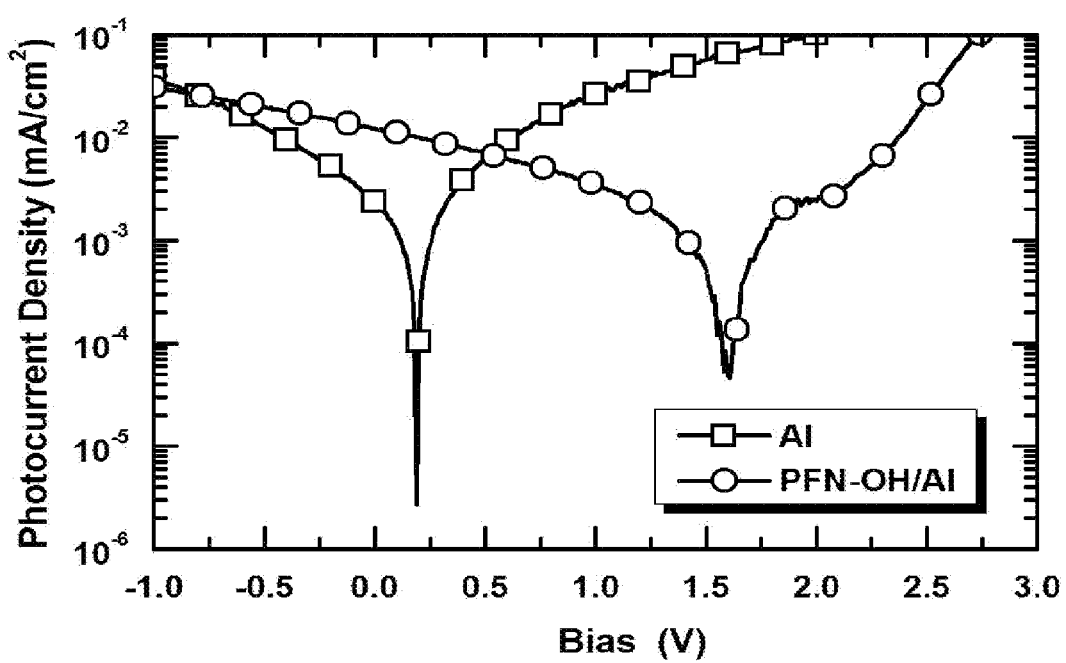
FIG. 6 graphically compares the performance of a representative device of the invention and a control device.

The devices can also be used as photovoltaics. FIG. 6 compares the open-circuit voltage of a neat Al device and a device of the invention. The open-circuit voltage moves from approximately 0.2 V for a neat Al device to about 1.6 V for a PFN-OH device. Because open-circuit voltage reflects the built-in potential across the junction, and the anode layer is identical in all devices, the result in FIG. 6 indicates that the effective barrier height for electron injection is substantially lowered by inserting a PFN-OH layer between the Al cathode and EML. This leads to a more balanced population of electrons and holes for more efficient recombination.

Figure 7A:
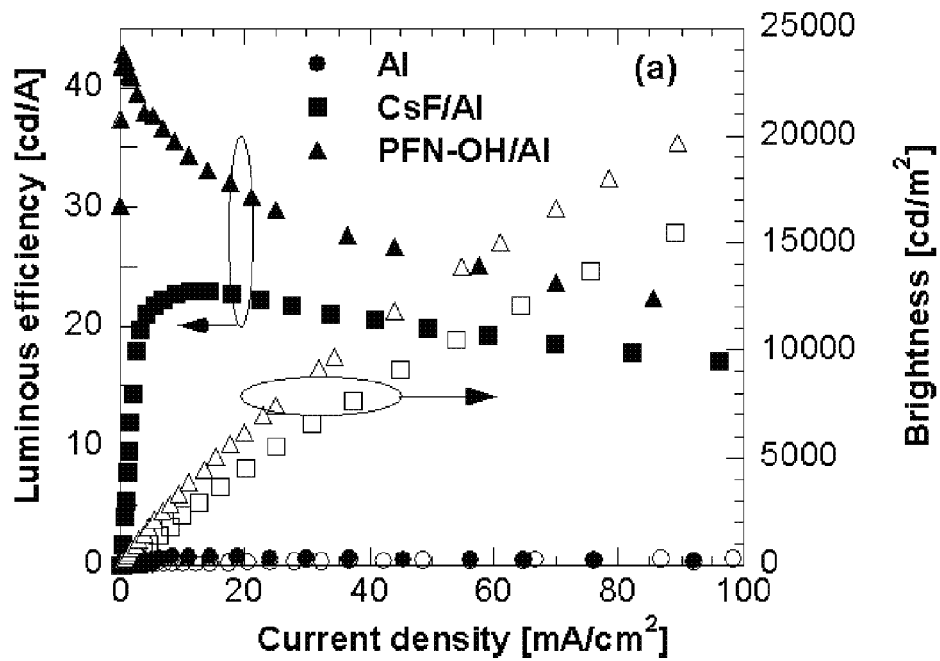
FIGS. 7A and 7B graphically compare the performance of representative devices of the invention and control devices.
Figure 7B:
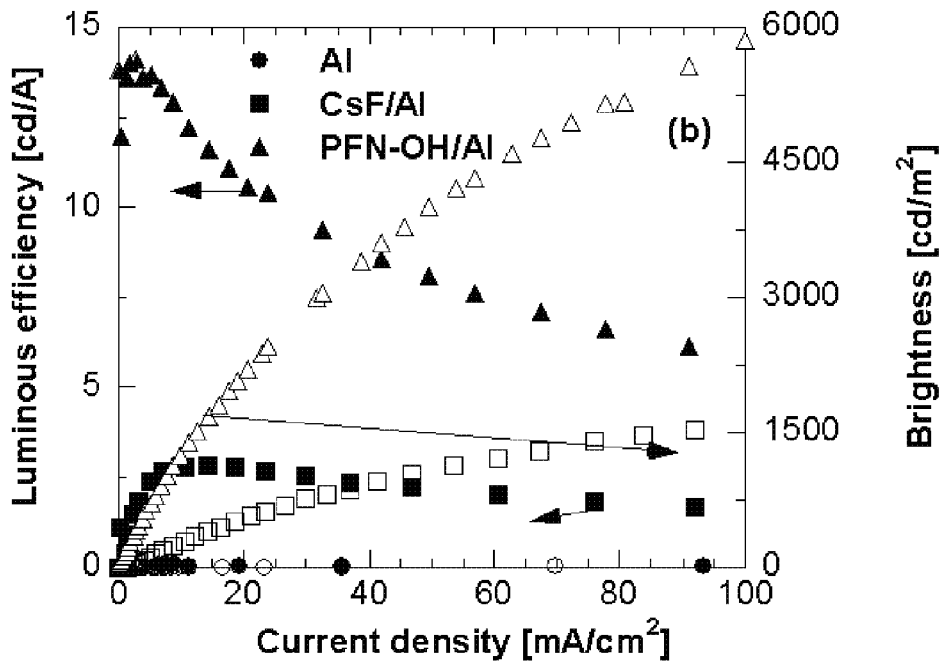

Electrophosphorescent device performance. The general applicability of polymers of the invention as EI layers was examined using a series of eletrophosphorescent OLEDs with the phosphorescent green emitter tris(2-phenylpyridine)iridium (Ir(ppy)$_3$) and blue emitter bis(4',6'-difluorophenylpyridinato)-tetrakis(1-pyrazolyl)borate (FIr6) as dopants. Using PFN-OH as the EI layer, the eletrophosphorescent devices also show greatly enhanced performance, regardless of the lower triplet energy of PFN-OH compared to the eletrophosphorescent dyes. FIG. 7A compares devices made using the emitter Ir(ppy)$_3$ and FIG. 7B compares devices made using the emitter FIr6. The neat Al devices for both emitters show very poor performance due to the large electron injection barrier between Al and the EML layer. The devices having CsF/Al as a cathode, (ITO/PEDOT/PVK:PBD (30 wt %):Ir(ppy)$_3$ (1 wt %)/CsF/Al), performed well, having a maximum LE of 23.1 cd/A at a current density of 10.0 mA/cm$^2$. Similar devices made with PFN-OH, having the structure ITO/PEDOT:PSS/PVK:PBD (30 wt %):Ir(mppy)$_3$ (1 wt %)/PFN-OH/Al, showed higher efficiency and brightness (LE=43.0 cd/A at a current density of 0.6 mA/cm$^2$ and a brightness of 257 cd/m$^2$) compared to other devices. Similarly, devices with the configuration ITO/PEDOT:PSS/PVK:OXD-7 (30 wt %):FIr6 (5 wt %)/PFN-OH/Al exhibited superior performance to Al and CsF/Al devices. The efficiency of the FIr6 device was 14.2 cd/A at a current density of 2.4 mA/cm$^2$ and a brightness of 344 cd/m$^2$.

Example 2

White Light-Emitting Diodes

White light-emitting diodes (WOLED) were fabricated on ITO-coated glass substrates. The substrates were ultrasonically cleaned with detergent, deionized water, acetone, and isopropyl alcohol. A layer of 40 nm thick poly(3,4-ethylene dioxythiophene):poly(styrene sulfonic acid) (PEDOT:PSS, H. C. Stack) was spin-coated onto the pre-cleaned and $O_2$-plasma-treated ITO substrates. The PEDOT:PSS layer was first baked at 100° C. for 0.5 h to remove residual water and then moved into a glovebox under argon to perform the subsequent multilayer fabrication process. PVK was purchased from Aldrich. FIrpic and OXD-7 were purchased from American Dye Sources Inc. Os-R was prepared according to published procedure (Tung et al., *Organometallics* 2004, 23, 3745). FIrpic, Os-R, OXD-7, and PVK were dissolved in chlorobenzene. 5 wt % FIrpic, 0.15 wt % Os-R, and 30 wt % OXD-7 were doped into a PVK host matrix and spin-cast on top of PEDOT as the emissive layer. Solvent was removed at 80° C. for 0.5 h. The thickness of the emissive layer was 70 nm. PFN-OH was dissolved in methanol or in a mixed solvent of water/methanol (¼ v/v). 20 nm thick PFN-OH electron transport layers were spin-coated on top of the EML from ethanol and water/ethanol solutions and then dried under vacuum at 100° C. for 10 min. Finally, a 120 nm thick layer of Al (cathode) was thermally evaporated on top of PFN-OH (ethanol) or PFN-OH(water/ethanol) under a vacuum of $1 \times 10^{-6}$ torr. As a control, a 120 nm thick Al layer, or a combined layers of Ba (4 nm) and Al (120 nm) (Ba/Al dual cathode) was evaporated on top of the EML or PFN-OH (water/ethanol) as a cathode. Device testing was carried out in air at room temperature. EL spectra were recorded using the Oriel Instaspec IV spectrometer with a CCD detector. Current-voltage (I-V) characteristics were measured on a Hewlett-Packard 4155B semiconductor parameter analyzer. The power of the EL emission in the direction normal to the ITO was measured using a calibrated Si-photodiode and a Newport 2835-C multifunctional optical meter. The external electroluminescent quantum efficiencies (QE) were measured in an integrating sphere (Labsphere) collecting all emitted photons. Photometric units ($cd/m^2$) were calculated using the forward output power together with the EL spectra of the devices under an assumption of the emission's Lambertian space distribution. The CIE coordinates were measured with a PR-650 SpectraScan spectrophometer (Photo Research). The morphology of PFN-OH films from different solutions were measured using tapping-mode measurements with a Nanoscope III AFM (Digital Instruments). The measurement of photocurrent versus voltage characteristics was performed using an illumination light intensity of 100 $mW/cm^2$ from a simulated AM1.5 light source (Oriel Co.). Open-circuit voltages were derived from the zero current point on photocurrent-voltage curves.

Figure 8A:
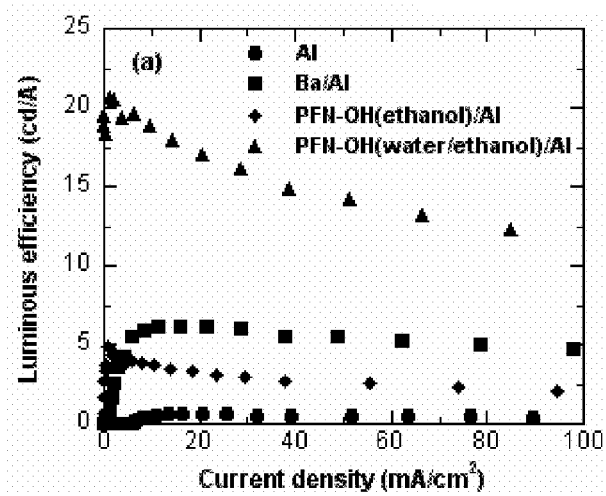
FIGS. 8A-8C graphically compare the performance of representative devices of the invention and control devices.

The luminous efficiency-current density (LE-J) characteristics of white OLEDs with four different cathodes (Al, Ba/Al, PFN-OH (ethanol)/Al, and PFN-OH (water/ethanol)/Al) are compared in FIG. 8A. PFN-OH films spin-coated from different solvents dramatically affect the performance of the devices. The maximum luminous efficiency (LE) of the PFN-OH (water/ethanol)/Al device is 20.7 cd/A and the LE of the PFN-OH (ethanol)/Al device is 4.83 cd/A.

Figure 8B:
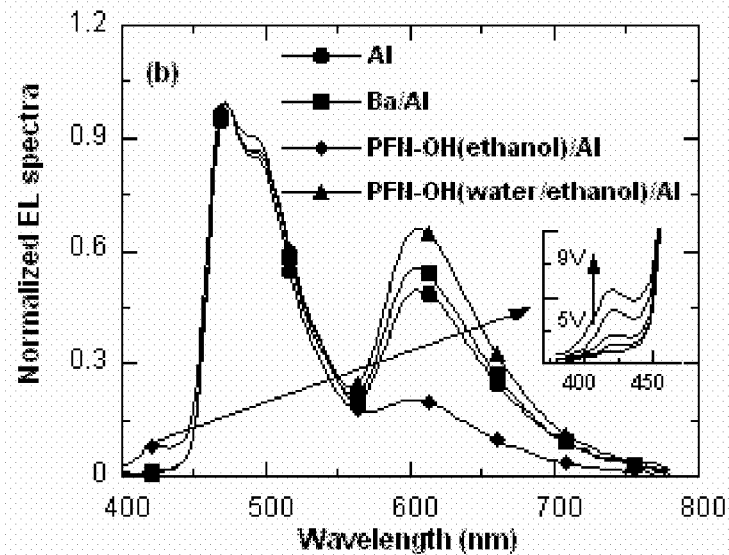

The EL spectra of typical devices are compared in FIG. 8B. The EL spectra of devices having Al, Ba/Al, and PFN-OH (water/ethanol)/Al cathodes all exhibit white light emission and the corresponding Commission Internationale de l'Eclairage (CIE) coordinates are (0.317, 0.348), (0.314, 0.347), and (0.324, 0.355), respectively. These coordinates are insensitive to current density and brightness. The emission peaks at 472 nm and 610 nm originate from the emission of FIrpic and Os-R, respectively.

Figure 8C:
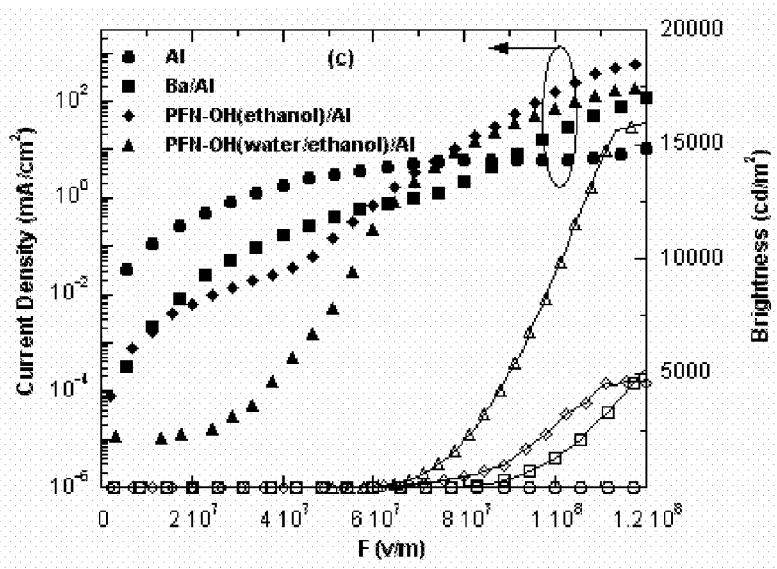

The current density and brightness versus electric field intensity characteristics of different cathodes are compared in FIG. 8C. At the same electric field intensity, the PFN-OH (water/ethanol)/Al device has a lower current density than the PFN-OH (ethanol)/Al device due to hole blocking in the water/ethanol device. Therefore, the PFN-OH (water/ethanol)/Al device has a higher luminous efficiency due to electron and hole recombination zone completely confined within the emissive layer. The external quantum efficiency and power efficiency for different cathodes are summarized in Table 2.

Figure 9A:
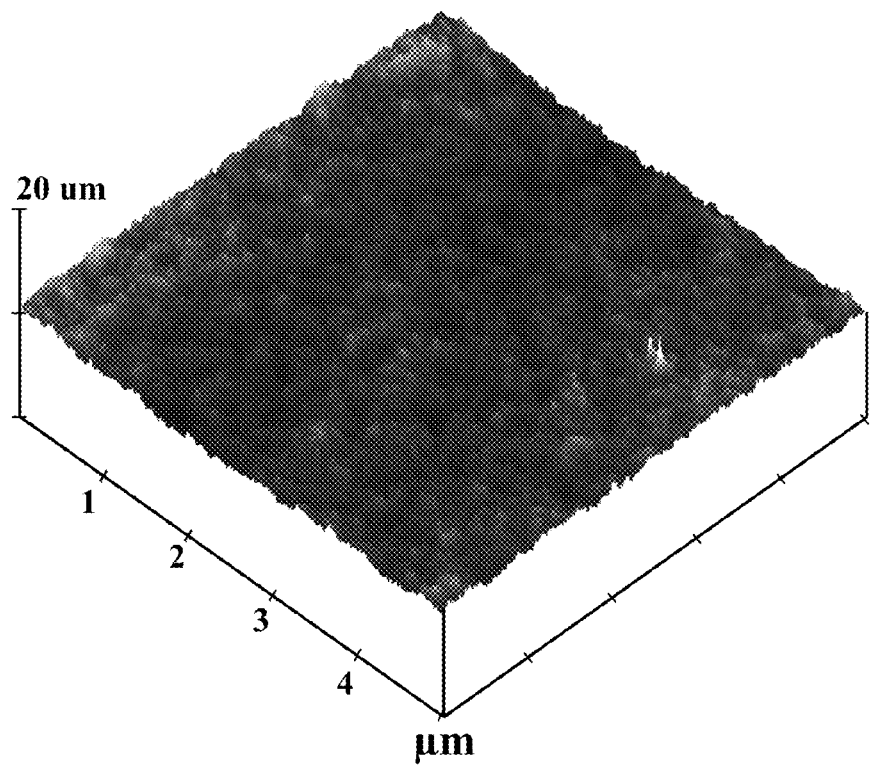
FIGS. 9A and 9B are atomic force microscope images of films of representative polymers of the invention.
Figure 9B:
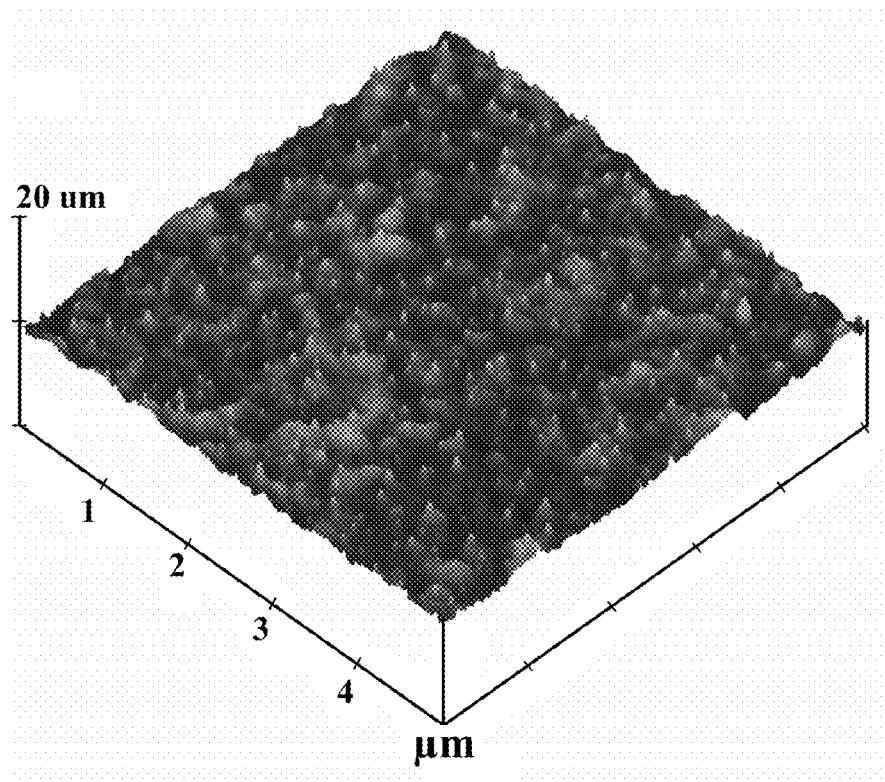

FIGS. 9A and 9B are atomic force microscopy (AFM) images of PFN-OH films spin cast onto the EML from different solutions. The images show a change in surface topography based on the solvent used. The surface of the PFN-OH film cast from an ethanol solution is smooth and uniform (FIG. 9A). The surface of the PFN-OH film cast from a water/ethanol solution is rough and has aggregate features (FIG. 9B). The surface roughness root mean square (rms) of the PFN-OH film increases from 0.71 nm to 1.55 nm by changing solvent from ethanol to water/ethanol. Typically, aggregation reduces device performance, but OLEDs based on aggregated films of polymers of the invention as EI layers have significantly enhanced luminous efficiency.

Figure 10A:
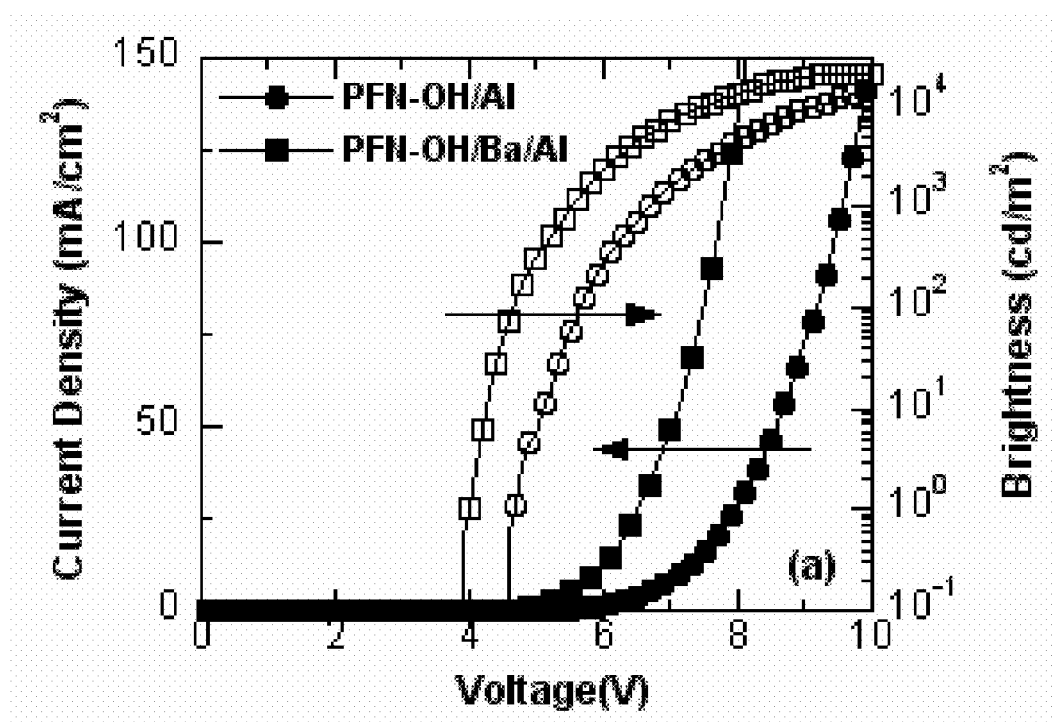
FIGS. 10A and 10B graphically compare the performance of representative devices of the invention.
Figure 10B:
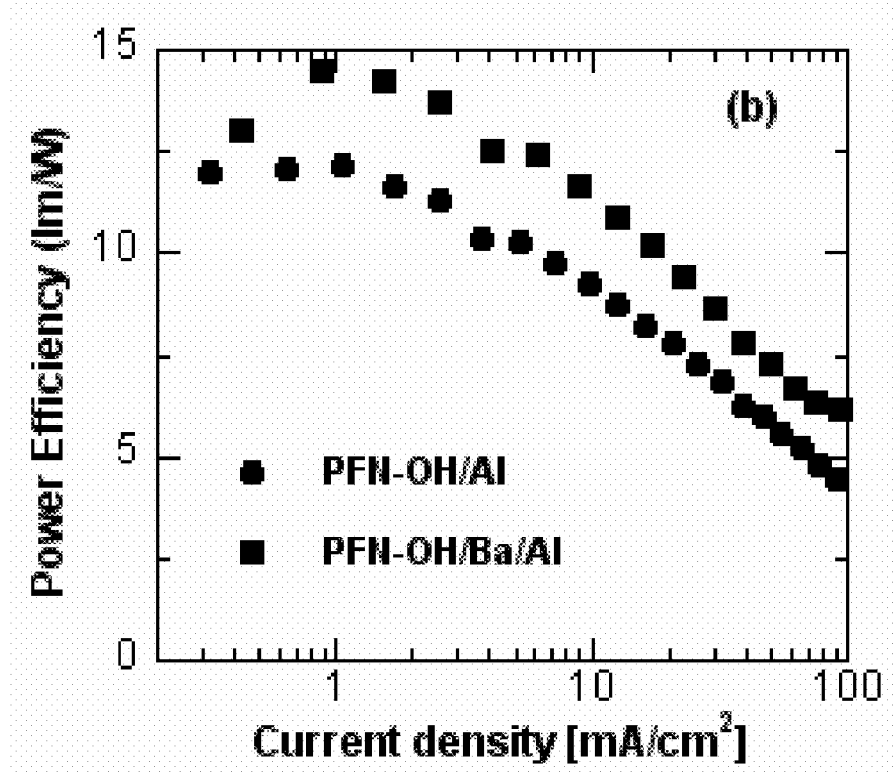

FIG. 10A compares the current density and brightness versus voltage characteristics (J-L-V) of devices with PFN-OH(water/ethanol)/Al and PFN-OH(water/ethanol)/Ba/Al as cathodes in devices having the configuration: ITO/PEDOT/FIrpic (5 wt. %):Os-R (0.15 wt %):PVK:OXD-7 (30 wt %)/cathode. A thin (4 nm) thick Ba layer inserted between PFN-OH (water/ethanol) and the Al cathode further improves device performance. The turn-on voltage (defined as the voltage required to give a brightness of 1 $cd/m^2$) of the device decreases from 4.5 V for the system using PFN-OH(water/ethanol)/Al to 3.9 V when PFN-OH(water/ethanol)/Ba/Al is used. The highest power efficiency reaches 14.5 lm/W at a brightness of 171 $cd/m^2$ (FIG. 10B). The LE of a device based on inserting a Ba layer between Al and PFN-OH processed from ethanol does not show any improvement in its device performance.

Example 3

Devices Fabricated with Electron Transport Layers Having a Polyether Linker

Figure 11:
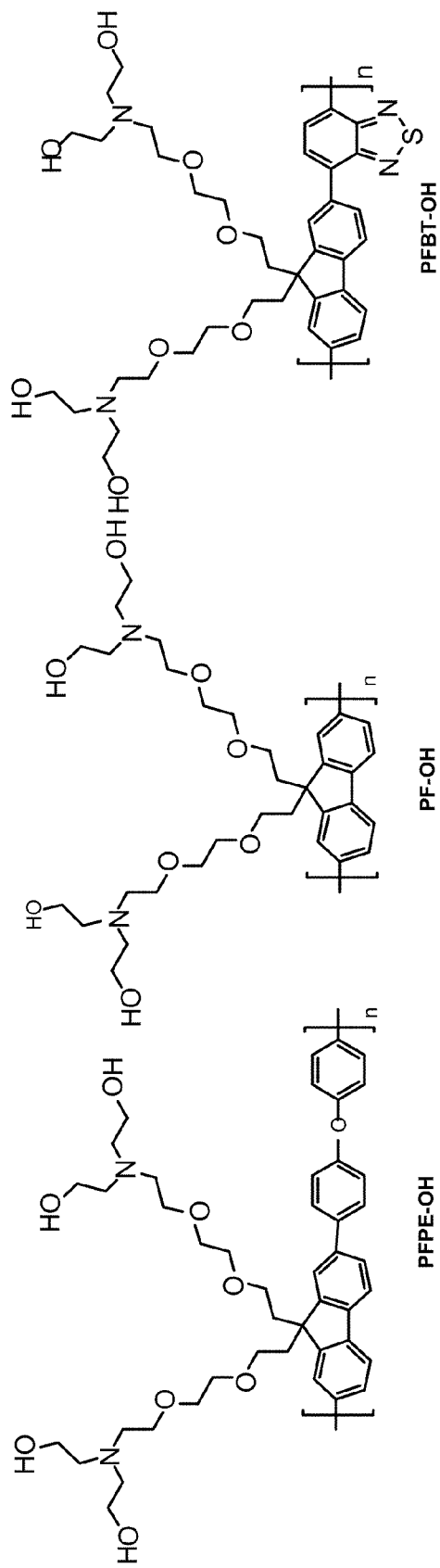
FIG. 11 graphically illustrates representative polymers of the invention.

Devices were fabricated using a series of EI materials having polyether linkers between the repeat unit and the nonionic pendant groups terminating with a hydrophilic group. Device fabrication was similar to that described above in Example 1. Representative EI materials having polyether linkers are illustrated in FIG. 11.

Figure 12:
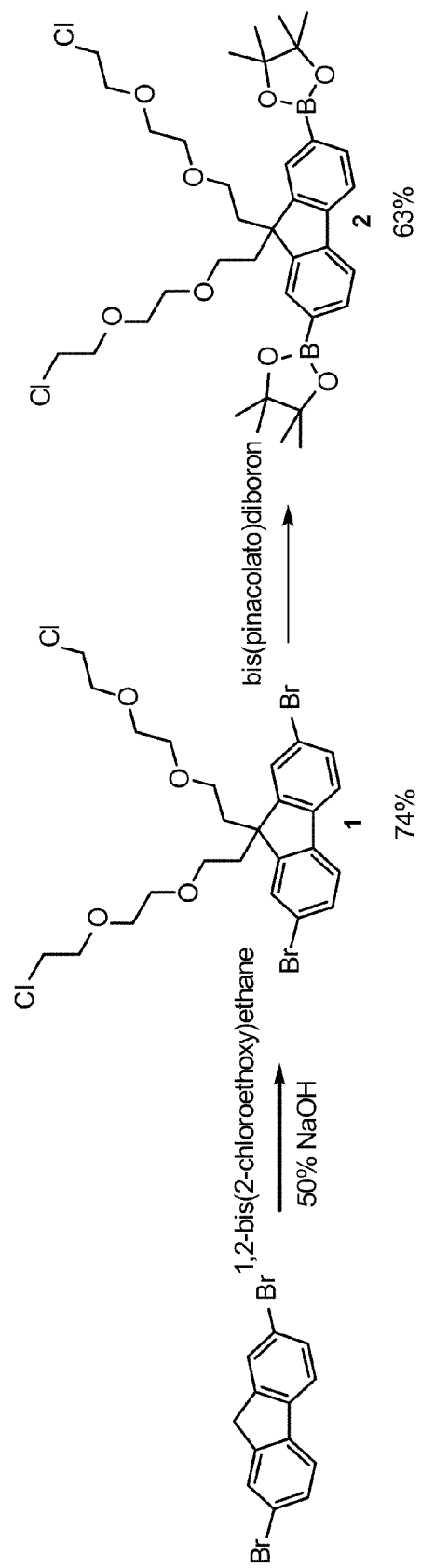
FIG. 12 schematically illustrates the synthesis of monomers useful in making polymers of the invention.
Figure 13:
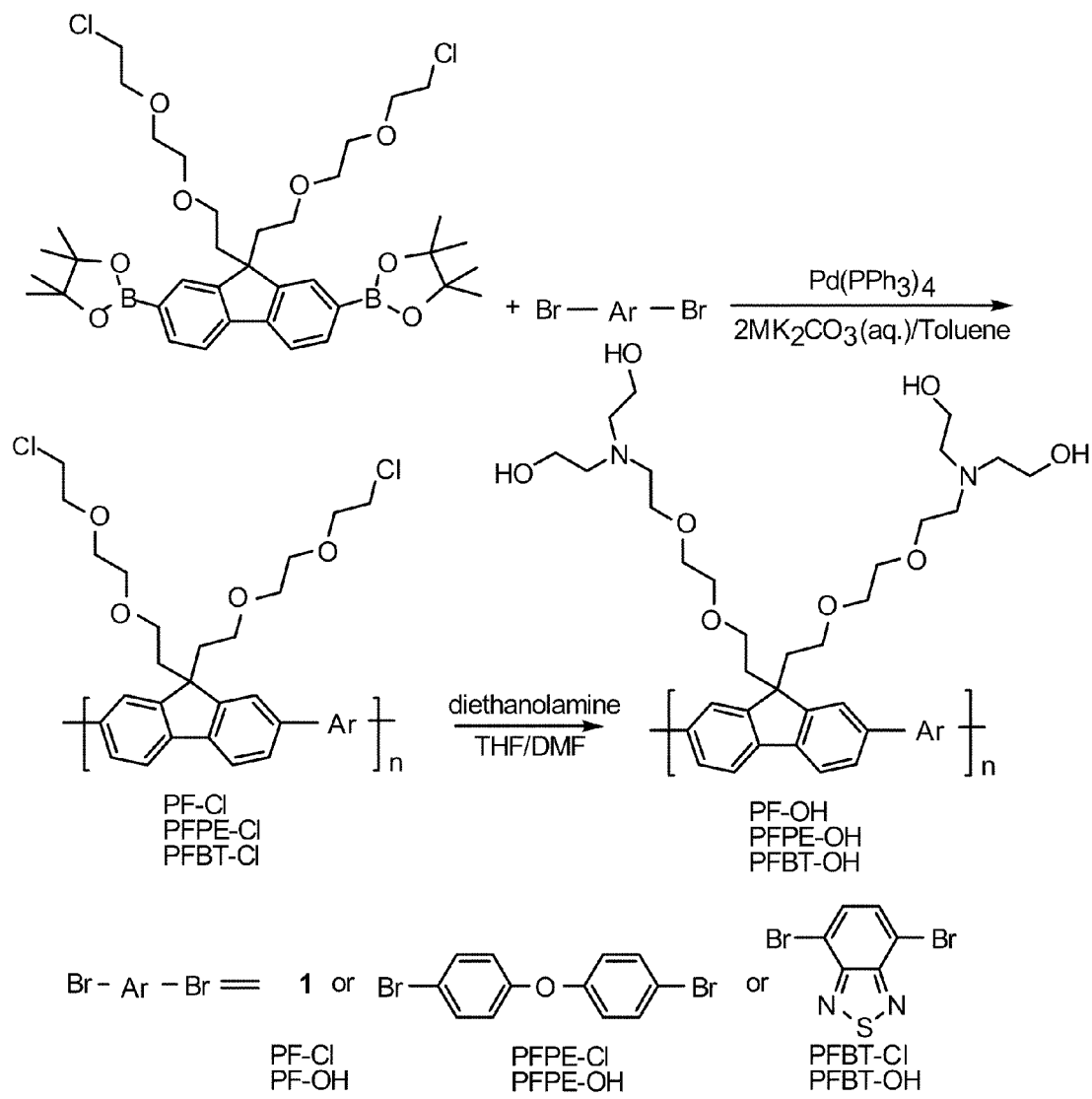
FIG. 13 graphically illustrates the synthesis of representative polymers of the invention.

The synthesis of representative compounds, PF-OH, PFPE-OH, and PFBT-OH, were performed as schematically illustrated in FIGS. 12 and 13.

Monomer 1. To 150 mL of 45% aqueous potassium hydroxide was added 7.9 g (24.4 mmol) 2,7-dibromofluorene, 47.5 g (256 mmol) 1,2-bis(2-chloroethoxy)ethane and 0.78 g (2.4 mmol) tetrabutylammonium bromide at 75° C. The mixture was stirred for 0.5 hours and cooled to room temperature. The aqueous layer was extracted with dichloromethane. The organic layer was washed with 1.0 M aqueous HCl, then brine and water, and dried over anhydrous magnesium sulfate. After removal of the solvent and excess 1,2-bis(2-chloroethoxy)ethane under reduced pressure, the residue was purified by column chromatography on silica gel (eluent ethyl acetate/hexanes, 2:5) to give Monomer 1, a white solid 11.4 g (74%).

Monomer 2. To a solution of Monomer 1 (6.5 g, 10.4 mmol), bis(pinacolato)diboron (5.9 g, 23.4 mmol), potassium acetate (6.9 g, 70 mmol) in dioxane (150 ml), and [1,1'-bis(diphenylphosphino)ferrocene]dichloropalladium(II) [Pd(dppf)Cl$_2$] (570 mg, 0.7 mmol) was added. The mixture was heated to 80° C. for 8 hr and cooled to room temperature. The organic solvent was removed. The residue was dissolved in $CH_2Cl_2$, washed with brine and water, and dried over sodium sulfate. After removing the solvents, the residue was purified by column chromatography on silica gel (eluent ethyl acetate/hexanes, 2:5) to give the Monomer 2 (4.73 g, 63%) as white solid.

PF-Cl. Monomer 1 (0.5 mmol, 313 mg), Monomer 2 (0.5 mmol, 360 mg) and Pd(PPh$_3$)$_4$ (5 mg) were placed in a 25 ml round-bottom flask. A mixture of 2M $K_2CO_3$ aqueous solution (3 mL) and toluene (5 mL) were added to the flask and the reaction was degassed. The mixture was refluxed with vigorous stirring for 3 days under nitrogen atmosphere. After the mixture was cooled to room temperature, it was poured into 200 ml of methanol. The precipitated material was recovered by filtration through a funnel. The resulting solid material (PF-Cl) was washed for 24 h using acetone to remove oligomers and catalyst residues (0.36 g, 77%). Gel-permeation chromatography (GPC) analysis showed a number-average molecular weight of $M_n$=36900 g mol$^{-1}$ and a polydispersity of 4.2.

PF-OH. Diethanolamine (0.5 g) was added to a solution of PF-Cl (100 mg) in a mixture of tetrahydrofuran (10 mL) and DMF (10 mL). The mixture was stirred vigorously for 48 h at room temperature. After removing the solvent under reduced pressure, water was added to precipitate the resulting polymer, which was then collected and dried in a vacuum oven to yield PF-OH (72 mg, 55.4%).

Figure 14:
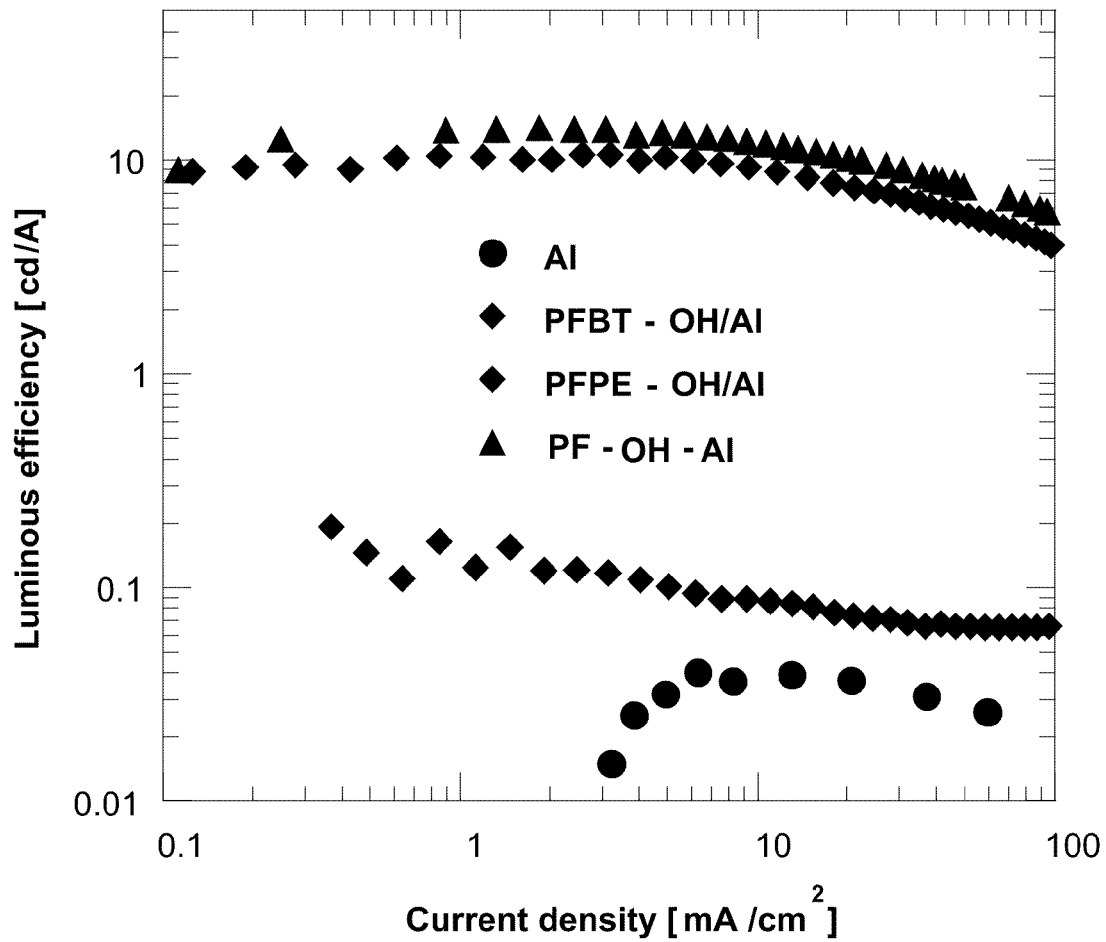
FIG. 14 graphically compares the performance of representative devices of the invention and a control device.
Figure 15:
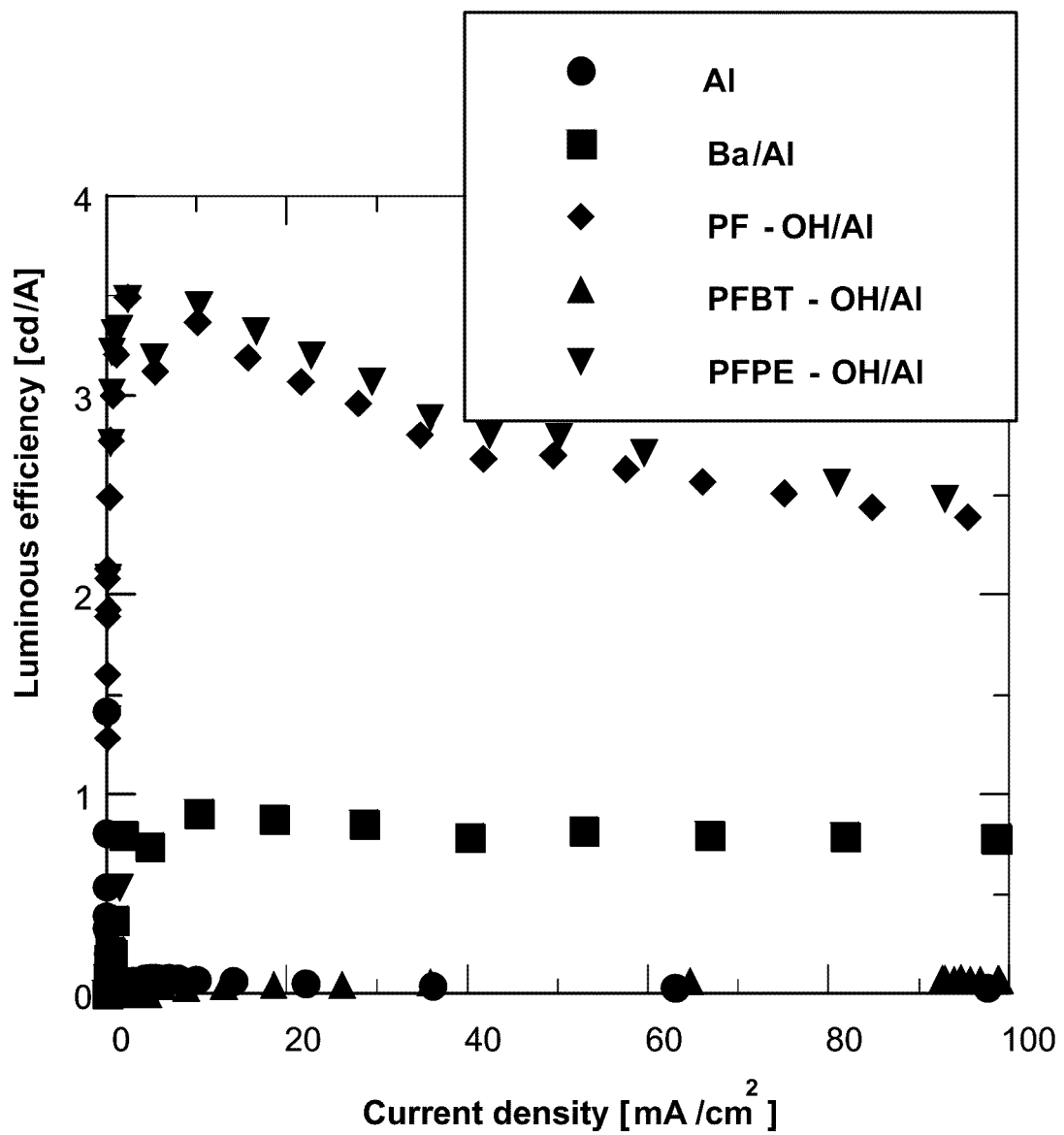
FIG. 15 graphically compares the performance of representative devices of the invention and control devices.
Figure 16:
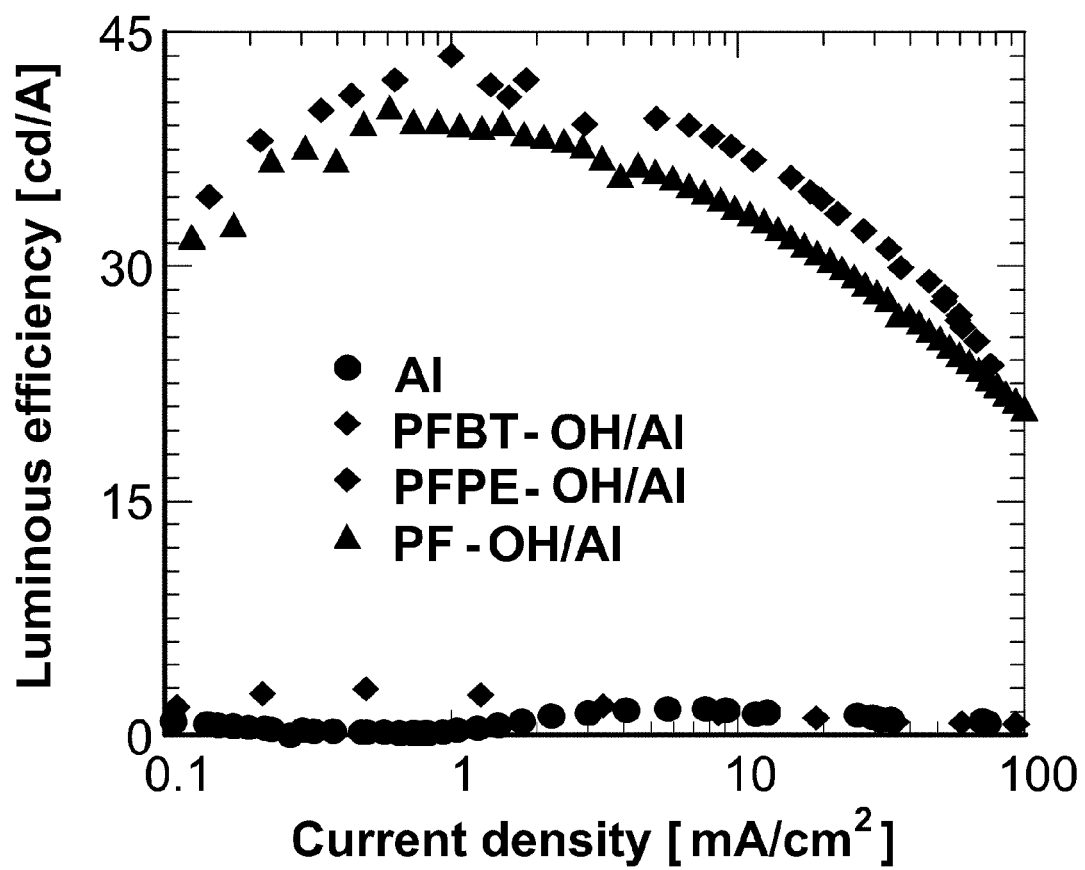
FIG. 16 graphically compares the performance of representative devices of the invention and a control device.

Device Characterization. FIG. 14 compares luminous efficiency versus current density characteristics for devices having the configuration: ITO/PEDOT/FIr6:PVK:OXD-7/cathode. Cathode materials include the polyethers PFBT-OH/Al, PFPE-OH/Al, and PF-OH/Al. Neat Al is used as a control. Both PF-OH/Al and PFPE-OH/Al devices show exceptional performance, similar to those of the PFN-OH/Al devices described in Examples 1 and 2. FIG. 15 compares luminous efficiency versus current density characteristics for red OLED devices having the structure: ITO/PEDOT/PVK/PFDBT/cathode. FIG. 16 compares luminous efficiency versus current density characteristics for green OLED devices having the structure: ITO/PEDOT/Ir(ppy)$_3$:PVK:PBD/cathode.

While illustrative embodiments have been illustrated and described, it will be appreciated that various changes can be made therein without departing from the spirit and scope of the invention.

The embodiments of the invention in which an exclusive property or privilege is claimed are defined as follows:

1. A nonionic polymer having repeating units having the structure:

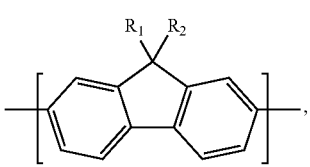

wherein M is a repeat unit; wherein $L_1$, $L_2$, and $L_3$ are independently selected from the group consisting of C2 to C20 alkylene and O2 to O20 polyether; $X_1$ and $X_2$ are independently selected from the group consisting of hydroxyl and thiol; and n is 1 or 2.

2. The polymer of claim 1, wherein M is selected from the group consisting of:

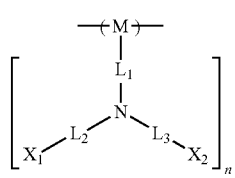

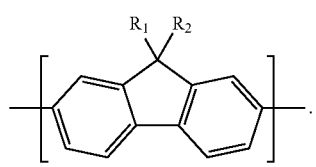

wherein $R_1$ is a nonionic pendant group terminating with a hydrophilic group and $R_2$ is selected from the group consisting of hydrogen, alkyl, and a nonionic pendant group terminating with a hydrophilic group.

3. The polymer of claim 1, wherein M is

4. The polymer of claim 1, wherein $L_1$ is independently selected from the group consisting of C6 alkylene or O2 polyether.

5. The polymer of claim 1, wherein $L_2$ is C2 alkylene.

6. The polymer of claim 1, wherein $L_3$ is C2 alkylene.

7. The polymer of claim 1, wherein $X_1$ and $X_2$ are independently selected from the group consisting of OH and SH.

8. The polymer of claim 1, wherein the number of repeating units is from about 3 to about 1000.

9. The polymer of claim 1, further comprising one or more second repeat units.

10. The polymer of claim 9, wherein the second repeat units is selected from the group consisting of:

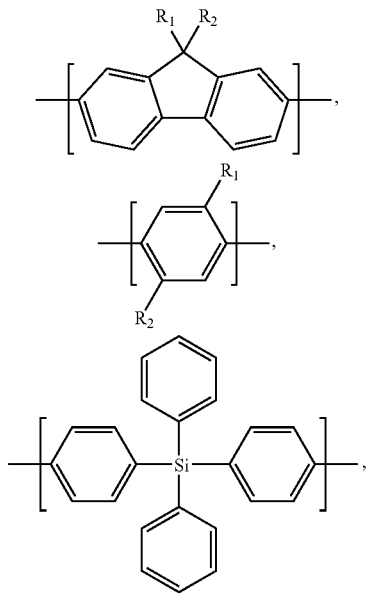

-continued

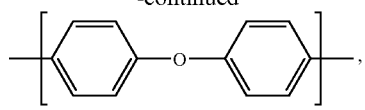

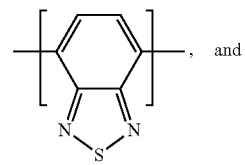, and

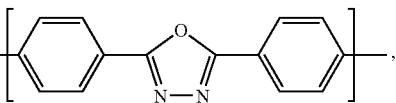

wherein $R_1$ and $R_2$ are independently selected from the group consisting of hydrogen, alkyl, and a nonionic pendant group terminating with a hydrophilic group.

* * * * *